(12) United States Patent
Ihara

(10) Patent No.: US 8,083,529 B2
(45) Date of Patent: Dec. 27, 2011

(54) SOCKET

(75) Inventor: Yoshihiro Ihara, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 13/104,078

(22) Filed: May 10, 2011

(65) Prior Publication Data

US 2011/0287671 A1 Nov. 24, 2011

(30) Foreign Application Priority Data

May 19, 2010 (JP) ................................ 2010-115532

(51) Int. Cl.
*H01R 12/00* (2006.01)
(52) U.S. Cl. ..................................... 439/76.1
(58) Field of Classification Search ................. 439/76.1, 439/76.2, 66, 55, 949
See application file for complete search history.

(56) References Cited

U.S. PATENT DOCUMENTS

| | | | | |
|---|---|---|---|---|
| 3,788,337 A | * | 1/1974 | Breer | 521/170 |
| 6,478,585 B2 | * | 11/2002 | Yuasa et al. | 439/76.2 |
| 7,110,246 B2 | * | 9/2006 | Tsunooka et al. | 361/637 |
| 7,264,486 B2 | | 9/2007 | Ma | |
| 2002/0028591 A1 | * | 3/2002 | Yuasa et al. | 439/76.2 |
| 2007/0155196 A1 | | 7/2007 | Cheng et al. | |

* cited by examiner

*Primary Examiner* — Tulsidas C Patel
*Assistant Examiner* — Phuongchi Nguyen
(74) *Attorney, Agent, or Firm* — IPUSA, PLLC

(57) ABSTRACT

A socket includes a first relay board mounted on a mounting board, a second relay board detachably mounted on the first relay board, and a frame part fixed to the first relay board. The frame part positions and holds the first and second relay boards, and positions detachably and holds an object of connection on the second relay board. The first relay board includes first and second conductor layers on its first and second surfaces, respectively. The second conductor layer is electrically connected to the mounting board. The second relay board includes third and fourth conductor layers on its first and second surfaces, respectively; and first and second connection terminals with a spring characteristic on the third and fourth conductor layers, respectively. The first and second connection terminals contact the object of connection and the first conductor layer, respectively, to electrically connect the object of connection and the mounting board.

16 Claims, 22 Drawing Sheets

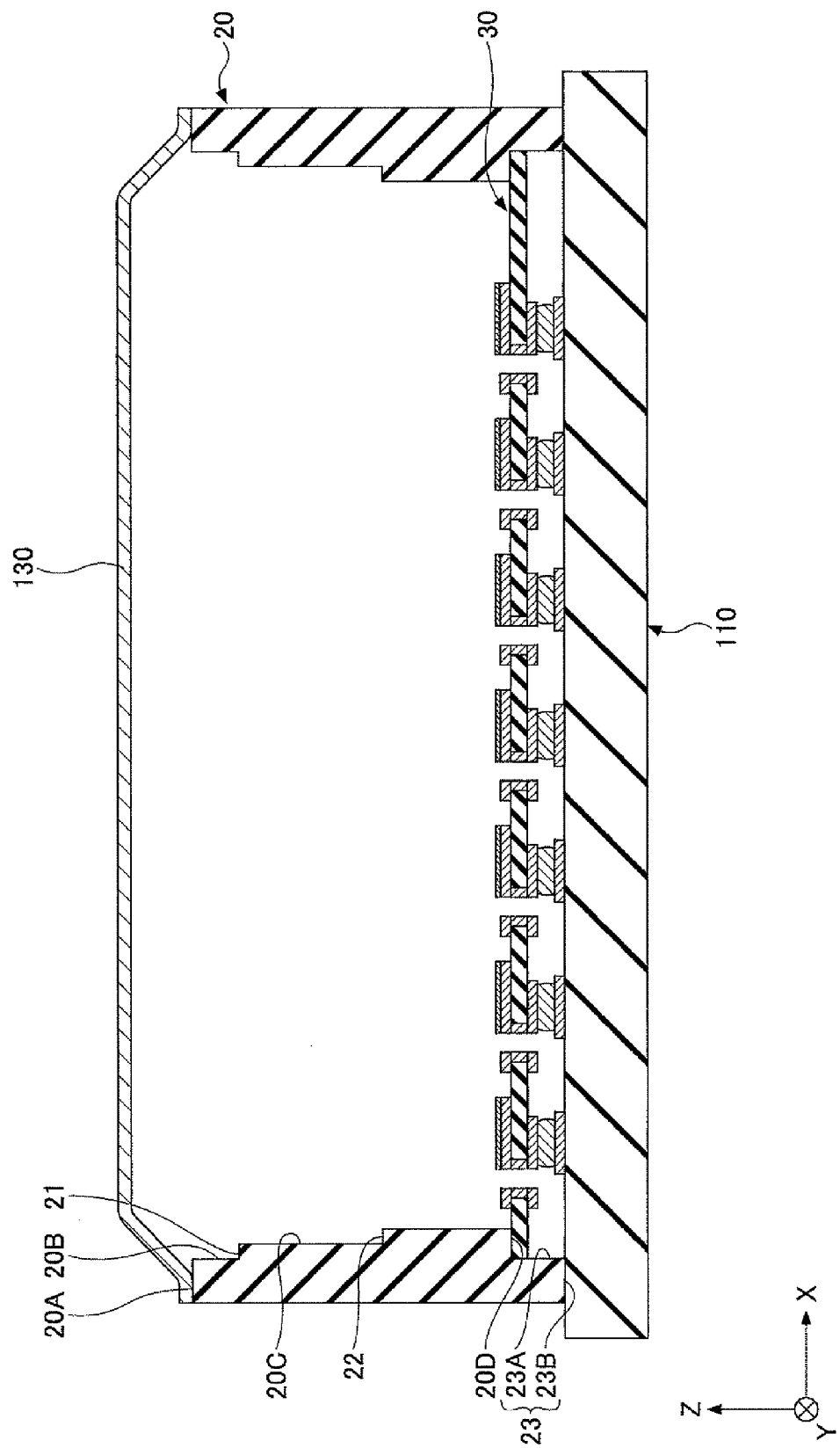

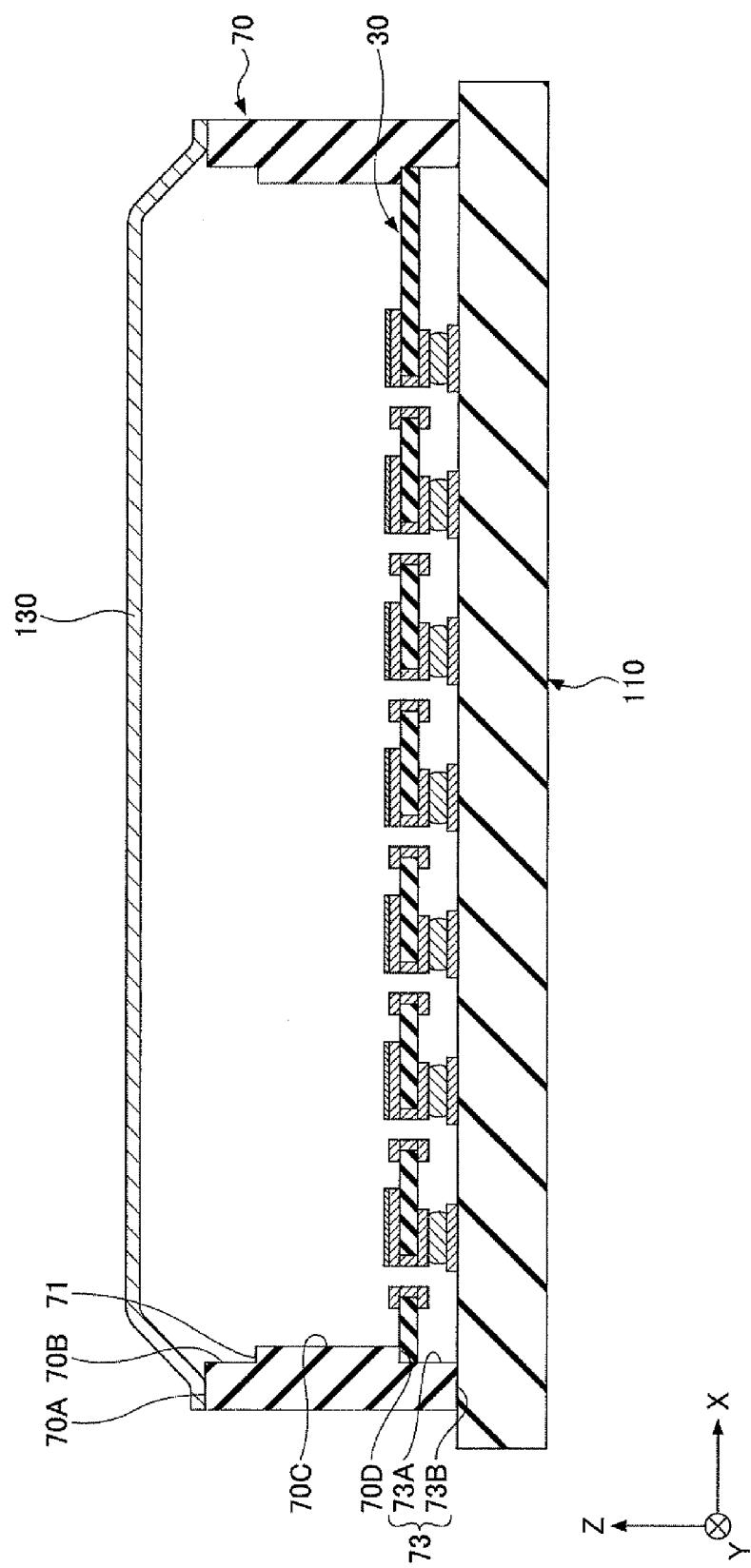

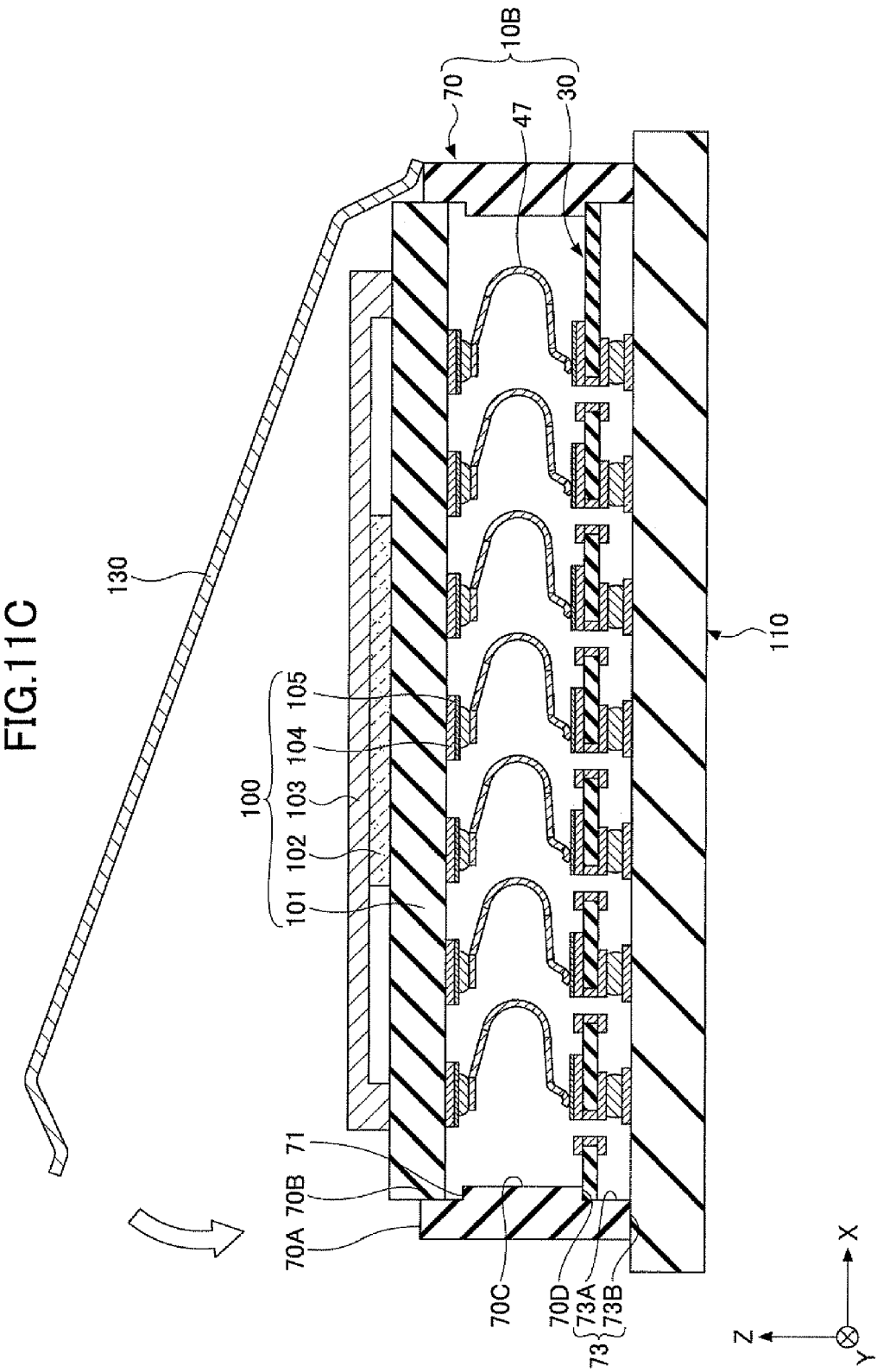

SOCKET

CROSS-REFERENCE TO RELATED APPLICATION

This application is based upon and claims the benefit of priority of the prior Japanese Patent Application No. 2010-115532, filed on May 19, 2010, the entire contents of which are incorporated herein by reference.

FIELD

A certain aspect of the embodiments discussed herein is related to sockets configured to establish an electrical connection.

BACKGROUND

Conventionally, sockets are known that are configured to electrically connect an object of connection (an object to be connected) to a mounting board or the like. FIG. 1 is a cross-sectional view of a conventional socket. Referring to FIG. 1, a conventional socket 200 includes a housing 201 formed by molding resin and electrically conductive connection terminals 202 having a spring characteristic.

Multiple through holes 201x are provided in the housing 201 at a given pitch. Each of the connection terminals 202 includes connecting parts 215 and 216 and a spring part 217, which are formed as a unit, and are fixed to the corresponding through holes 201x of the housing 201. The connecting parts 215 are joined to portions of the corresponding spring parts 217 projecting from the upper surface of the housing 201, and the connection parts 216 are exposed at the lower surface of the housing 201.

The connection parts 216 are electrically connected to a mounting board 209 such as a motherboard through corresponding solder balls 208. When an object of connection 205 having pads 206, such as a wiring board or a semiconductor package, is pressed toward the housing 201, the connecting parts 215 come into contact with the corresponding pads 206. As a result, the connection terminals 202 and the object of connection 205 are electrically connected. That is, the object of connection 205 is electrically connected to the mounting board 209 such as a motherboard via the connection terminals 202. (See, for example, U.S. Pat. No. 7,264,486 and U.S. Patent Application Publication No. 2007/0155196.)

SUMMARY

According to an aspect of the invention, a socket includes a first relay board mounted on a mounting board; a second relay board detachably mounted on the first relay board; and a frame part fixed to the first relay board, wherein the frame part is configured to position and hold the first relay board and the second relay board, and to position detachably and hold an object of connection on the second relay board, the first relay board includes a first conductor layer and a second conductor layer formed on a first surface and a second surface, respectively, of the first relay board, the first surface facing away from the mounting board, the second surface facing toward the mounting board, the second conductor layer being electrically connected to the mounting board, the second relay board includes a third conductor layer and a fourth conductor layer formed on a first surface and a second surface, respectively, of the second relay board, the first surface facing away from the mounting board, the second surface facing toward the mounting board; and a first connection terminal and a second connection terminal, each having a spring characteristic, formed on the third conductor layer and the fourth conductor layer, respectively, and wherein the first connection terminal and the second connection terminal are configured to come into contact with a pad of the object of connection and the first conductor layer, respectively, so that the object of connection and the mounting board are electrically connected.

According to an aspect of the invention, a socket includes a relay board mounted on a mounting board; and a frame part fixed to the relay board, wherein the frame part is configured to position and hold the relay board, and to position detachably and hold an object of connection, having a connection terminal having a spring characteristic, on the relay board so that the connection terminal faces the relay board, the relay board includes a first conductor layer and a second conductor layer formed on a first surface and a second surface, respectively, of the relay board, the first surface facing away from the mounting board, the second surface facing toward the mounting board, the second conductor layer being electrically connected to the mounting board, and the connection terminal comes into contact with the first conductor layer so that the object of connection and the mounting board are electrically connected.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF DRAWINGS

FIGS. 6A through 6F are diagrams illustrating a connecting method using the socket according to the first embodiment;

FIG. 11A through 11C are diagrams illustrating a connecting method using the socket according to the second embodiment.

DESCRIPTION OF EMBODIMENTS

Figure 1:
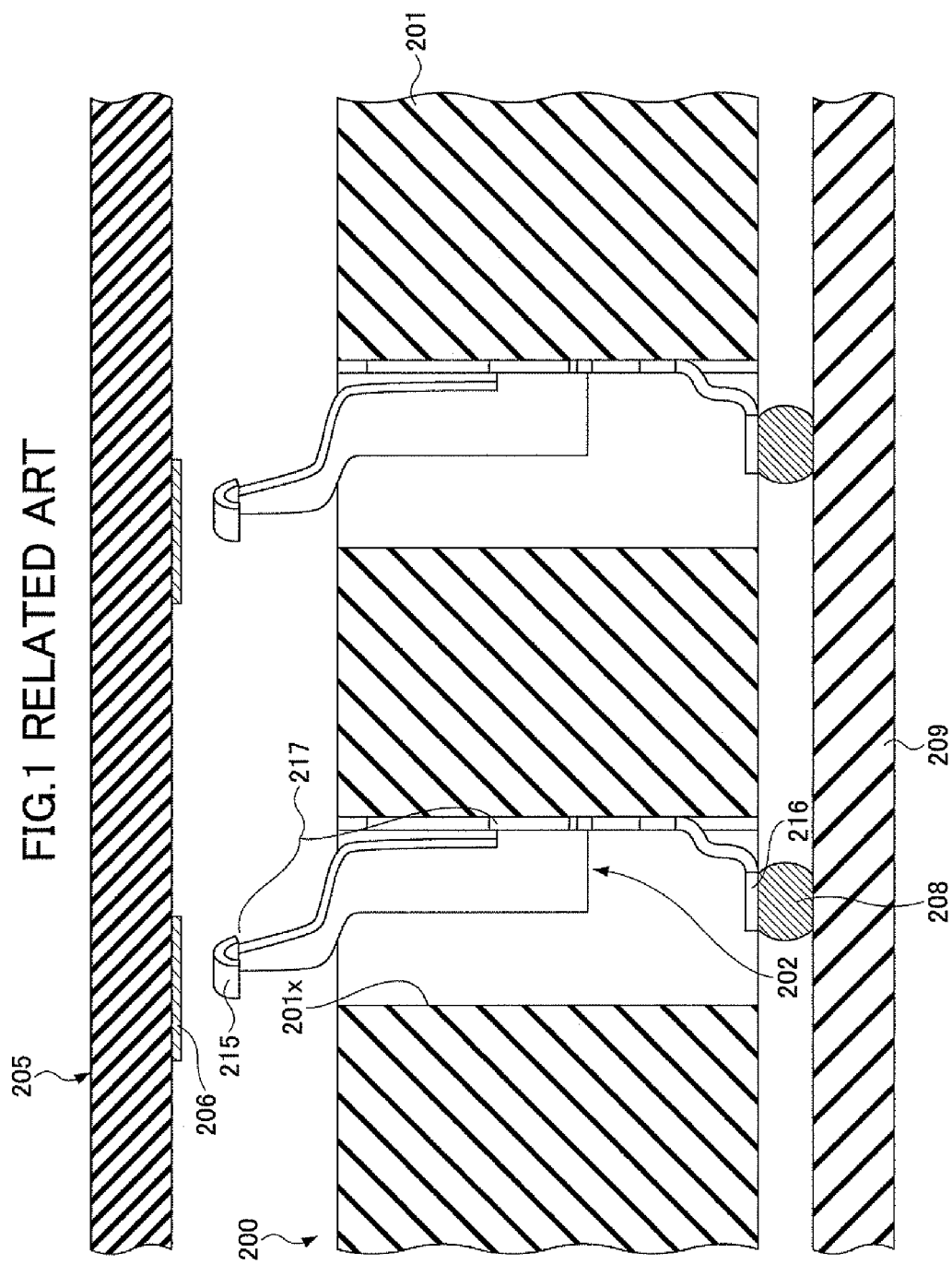
FIG. 1 is a cross-sectional view of a conventional socket.

Referring again to FIG. 1, the housing 201 may be warped because of heat applied to the resin when the resin is molded into the housing 201. Further, when the connection terminals 202 and the mounting board 209 such as a motherboard are connected via the solder balls 208, the solder balls 208 are caused to melt by being heated to, for example, approximately 230° C. At this point, the housing 201 formed by molding the resin also has approximately the same temperature, so that the housing 201 may warp.

Such warpage of the housing 201 increases if the pitch between adjacent connection terminals 202 (adjacent through holes 201x) or the thickness of the housing 201 is reduced in the socket 200. The warpage of the housing 201 contributes to a decrease in the reliability of the connection between the connection terminals 202 and the mounting board 209 such as a motherboard.

According to an aspect of the invention, a socket is provided that makes it possible to prevent the occurrence of warpage and accordingly to increase the reliability of the connection between connection terminals and a mounting board.

A description is given below, with reference to the accompanying drawings, of embodiments of the present invention. In the drawings, the same elements are referred to by the same reference numerals, and a redundant description thereof may be omitted.

In the below-described embodiments and their variations, by way of example, a semiconductor package, a first relay board, and a second relay board are illustrated as having a rectangular planar shape. However, the semiconductor package, the first relay board, and the second relay board are not limited to a rectangle in planar shape, and may have any planar shape.

[a] First Embodiment

Figure 2:
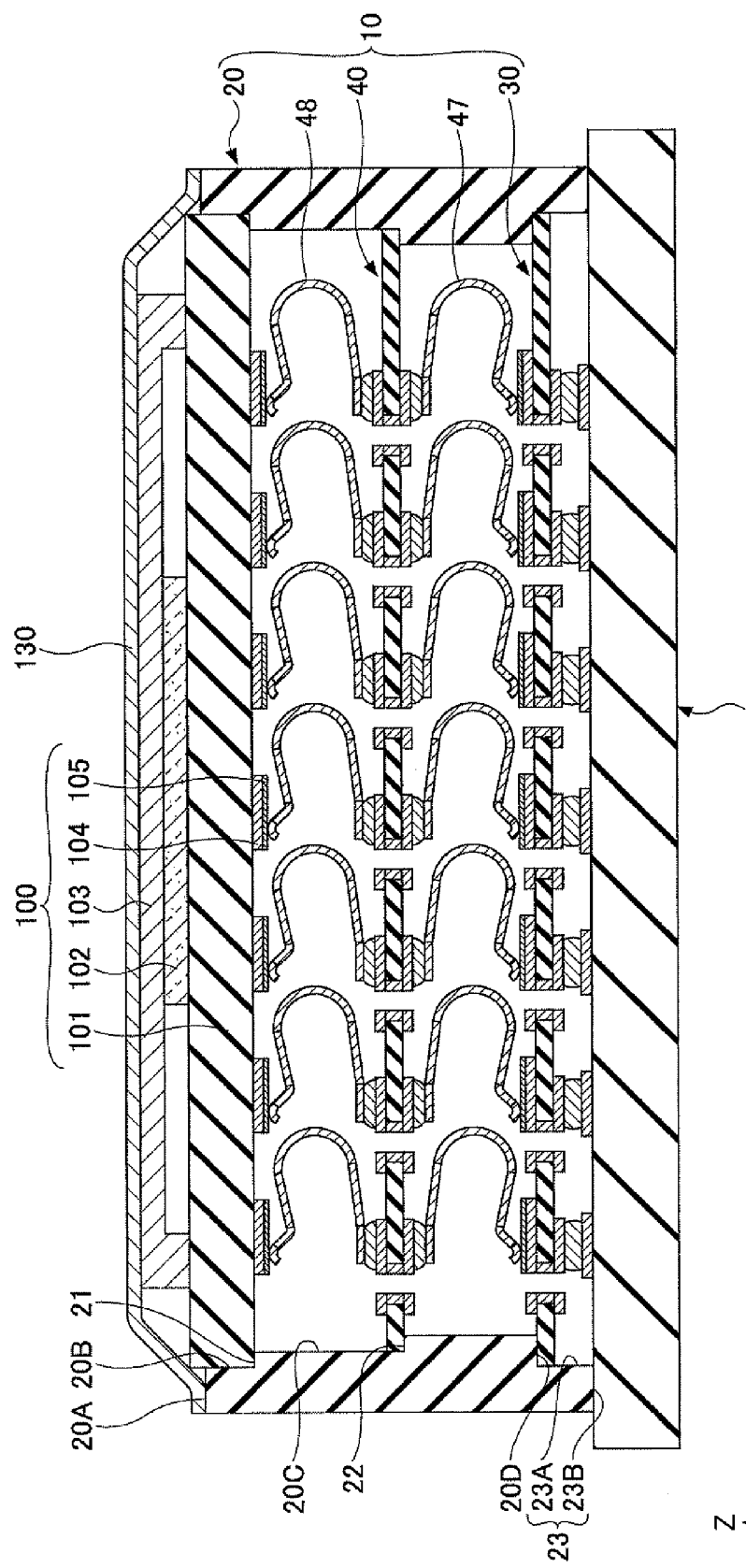
FIG. 2 is a cross-sectional view of a socket according to a first embodiment.
Figure 3:
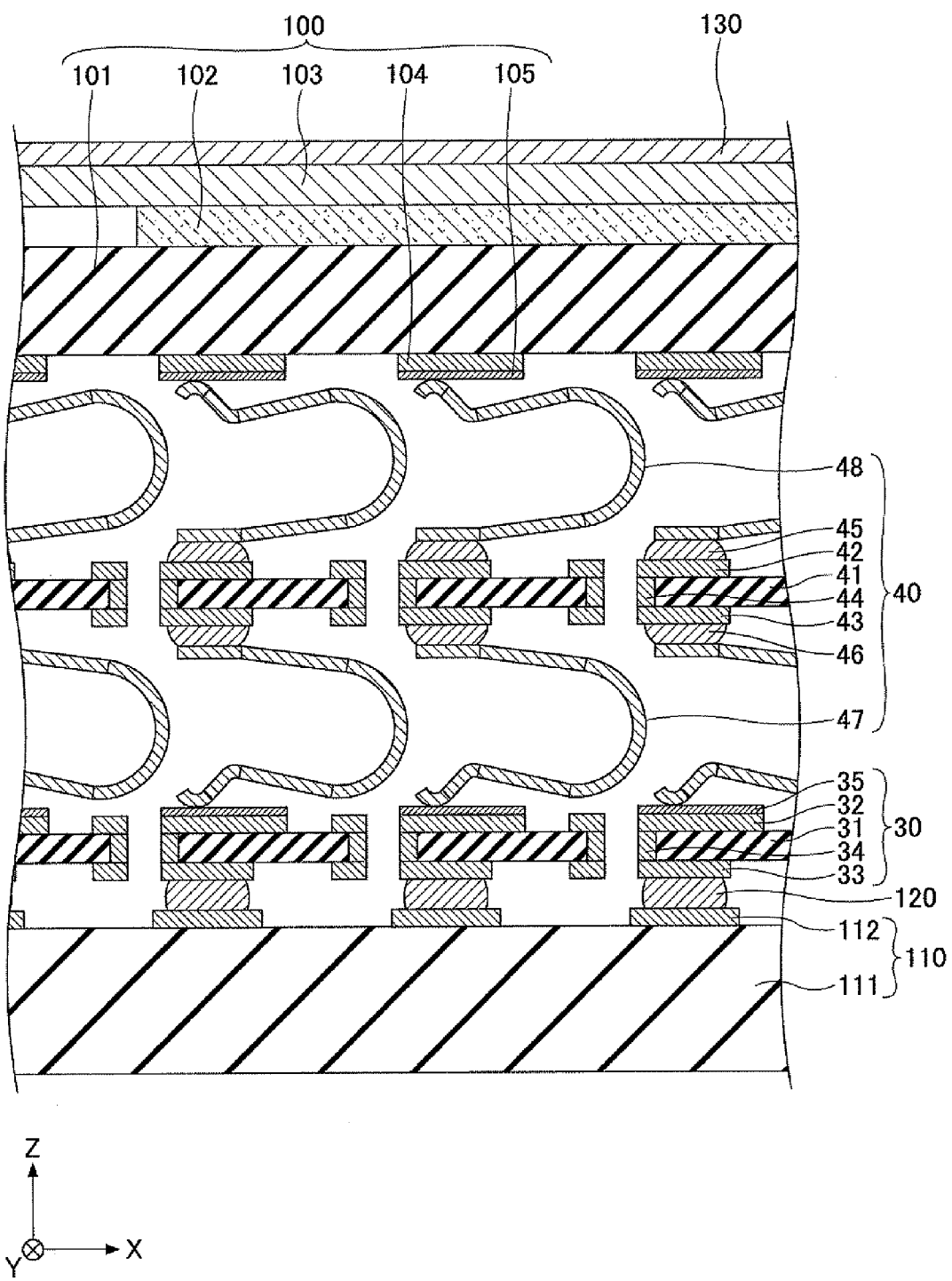
FIG. 3 is an enlarged view of part of FIG. 2 according to the first embodiment.

FIG. 2 is a cross-sectional view of a socket according to a first embodiment. FIG. 3 is an enlarged view of part of FIG. 2. Referring to FIG. 2 and FIG. 3, a socket 10 includes a frame part 20, a first relay board 30, and a second relay board 40. A semiconductor package 100, which is an object of connection (an object to be connected), is electrically connected to a mounting board 110 such as a motherboard via the socket 10. Reference numeral 130 denotes a lid part. In this embodiment, by way of example, a description is given, illustrating the semiconductor package 100 as an object of connection. However, the object of connection may also be a wiring board without a semiconductor chip.

A description is given below, with reference to FIG. 2, FIG. 3, and FIGS. 4A, 4B, and 4C, of the socket 10, the semiconductor package 100, and the mounting board 110.

Figure 4A:
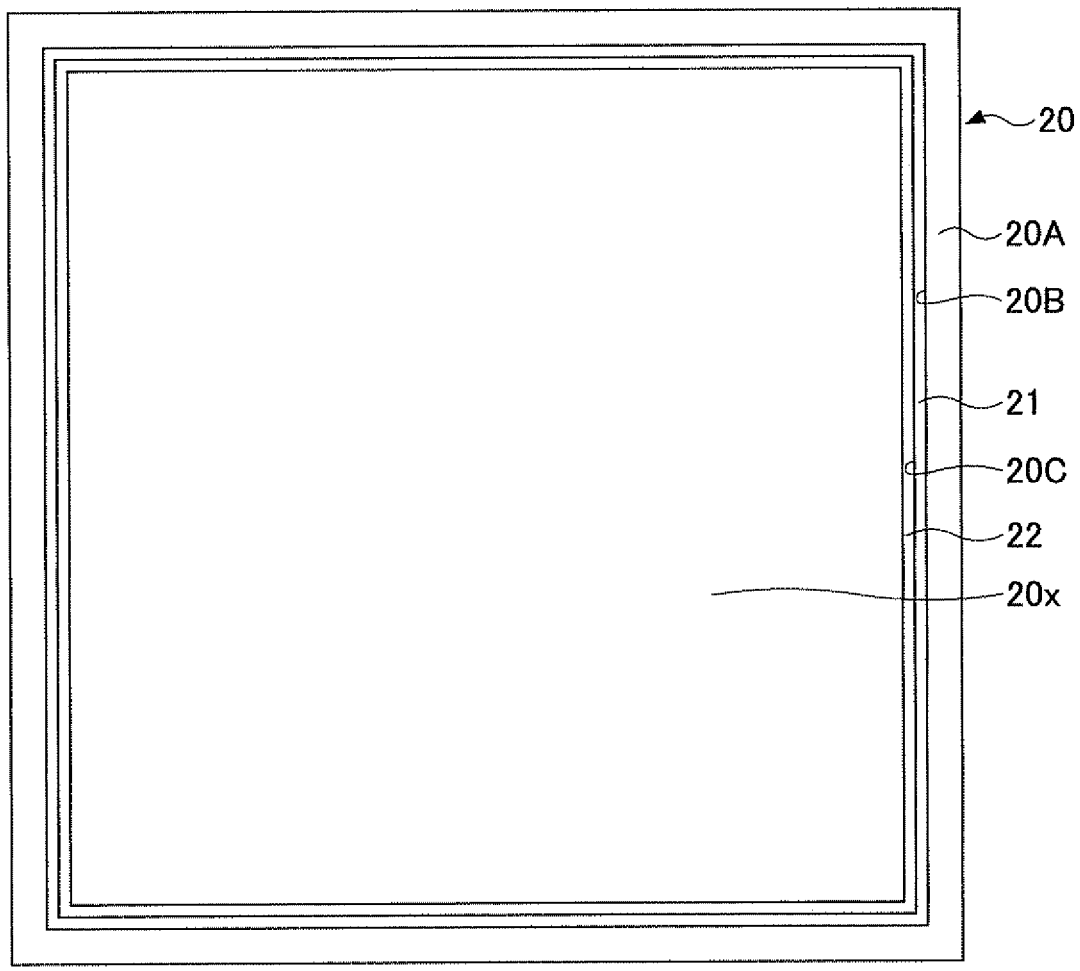
FIG. 4A is a plan view of a frame part of the socket according to the first embodiment.
Figure 4B:
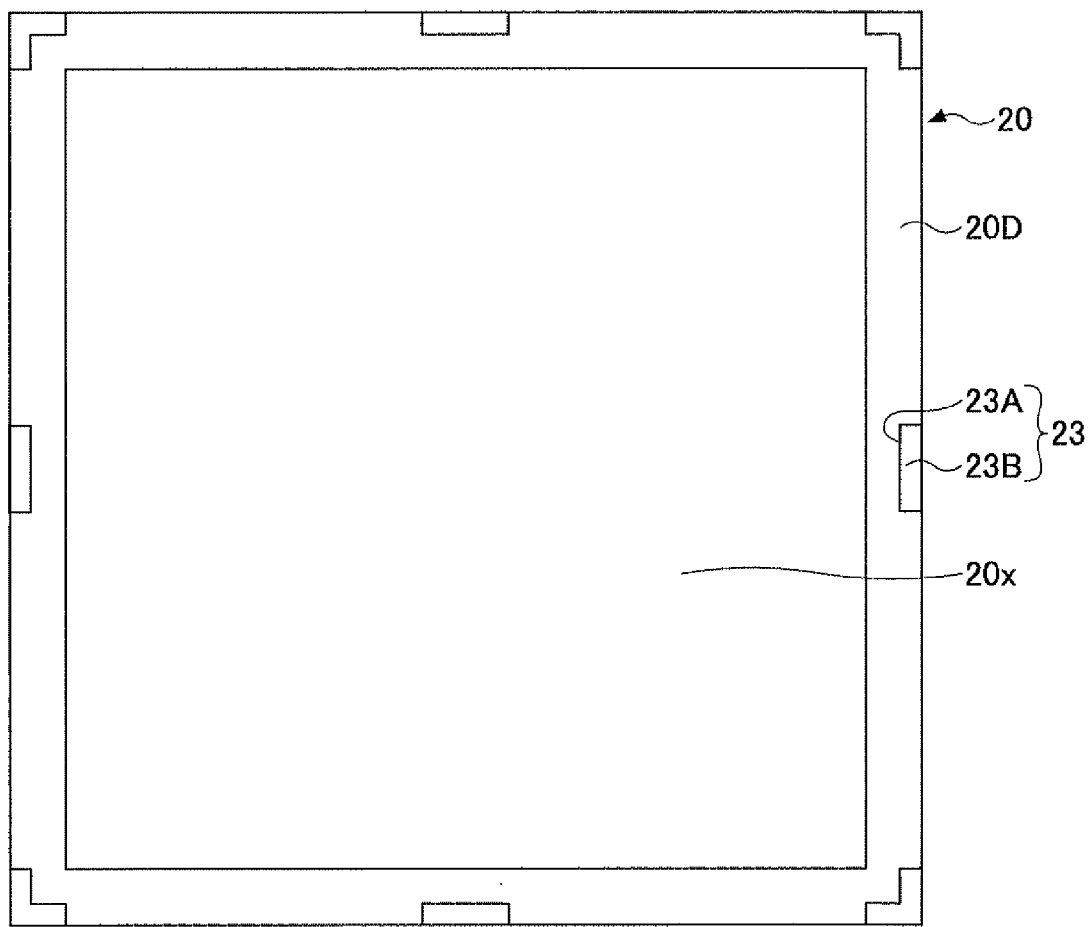
FIG. 4B is a bottom view of the frame part of the socket according to the first embodiment.
Figure 4C:
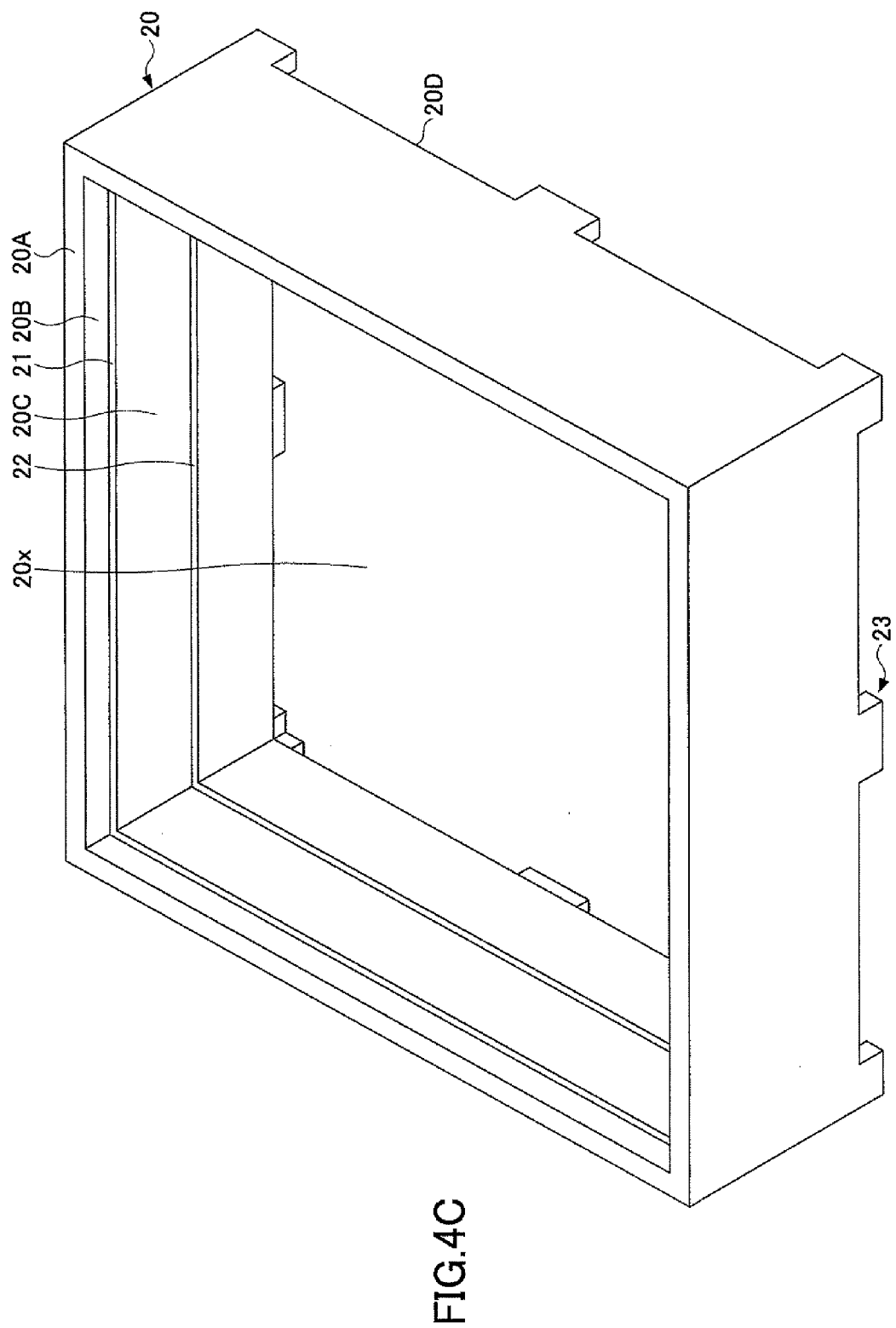
FIG. 4C is a perspective view of the frame part of the socket according to the first embodiment.

FIGS. 4A through 4C are diagrams illustrating the frame part 20 of the socket 10 according to the first embodiment. FIGS. 4A through 4C are a (top) plan view, a bottom view, and a perspective view, respectively, of the frame part 20. Referring to FIGS. 4A through 4C, the frame part 20 is a frame-shaped member having an opening 20x in the center, and includes a first positioning and holding part 21, a second positioning and holding part 22, and a third positioning and holding part 23. The frame part 20 is formed of resin, metal, etc. The frame part 20 is configured to position and hold and further align the first relay board 30, the second relay board 40, and the semiconductor package 100. Further, the frame part 20 is configured to prevent the interval between the first relay board 30 and the second relay board 40 and the interval between the second relay board 40 and the semiconductor package 100 from being less than or equal to respective predetermined values.

The first positioning and holding part 21 may be a surface provided like a frame at a position inside and one step lower than an upper surface 20A of the frame part 20. The first positioning and holding part 21 is in contact with an outer edge part of the lower surface of a board 101 of the semiconductor package 100. The frame part 20 includes a four-sided interior surface 20B. The shape of the opening defined by the interior surface 20B is rectangular in accordance with the planar shape of the semiconductor package 100. Further, the opening defined by the interior surface 20B is slightly larger than the outer shape of the board 101 so as to allow attachment and detachment of the semiconductor package 100. The interior surface 20B and the side surfaces of the board 101 may be either in contact or separated by such a gap as to cause no misalignment between the second relay board 40 and the semiconductor package 100.

The second positioning and holding part 22 may be a surface provided like a frame at a position inside and another one step lower than the first positioning and holding part 21. The second positioning and holding part 22 is in contact with an outer edge part of the lower surface of the second relay board 40. The frame part 20 includes a four-sided interior surface 20C. The shape of the opening defined by the interior surface 20C is rectangular in accordance with the planar shape of the second relay board 40. Further, the opening defined by the interior surface 20C is slightly larger than the outer shape of the second relay board 40 so as to allow attachment and detachment of the second relay board 40. The interior surface 20C and the side surfaces of the second relay board 40 may be either in contact or separated by such a gap as to cause no misalignment between the second relay board 40 and the semiconductor package 100 or between the second relay board 40 and the first relay board 30.

The third positioning and holding part 23 may be multiple projecting parts so provided on an outer edge part of a lower surface 20D of the frame part 20 as to project from the lower surface 20D. The first relay board 30 is press-fit into the third positioning and holding part 23, so that the lower surface 20D of the frame part 20 and an interior surface 23A (of the projecting parts) of the third positioning and holding part 23 are in contact with an outer edge part of the upper surface and the side surfaces, respectively, of the first relay board 30. The shape of the opening defined by the interior surface 23A is rectangular in accordance with the planar shape of the first relay board 30. Further, the shape of the opening defined by the interior surface 23A is substantially the same as the outer shape of the first relay board 30 so as to allow press-fitting of the first relay board 30. The vertical distance from the lower surface 20D of the frame part 20 to a bottom surface 23B (of the projecting parts) of the third positioning and holding part 23 is substantially the same as the vertical distance from the upper surface of the mounting board 110 to the upper surface of the first relay board 30. The bottom surface 23B of the third positioning and holding part 23 is in contact with the mounting board 110.

The frame part 20 is not fixed (directly) to the mounting board 110. However, since the first relay board 30 is fixed to the mounting board 110 with solder 120 (FIG. 3), the frame part 20, into which the first relay board 30 is press-fit, is also fixed indirectly to the mounting board 110.

The mounting board 110 (such as a motherboard) includes a board body 111 and a conductor layer 112. The conductor layer 112 is formed on one surface of the board body 111. The board body 111 is, for example, glass cloth impregnated with insulating resin such as epoxy resin. Examples of the material of the conductor layer 112 include copper (Cu). According to this embodiment, the surface of the conductor layer 112 is not treated with gold (Au) plating or the like for better connection reliability.

The first relay board 30 of the socket 10 includes a board body 31, conductor layers 32 and 33, via interconnects 34, and a noble metal layer 35. The conductor layer 32 and the noble metal layer 35 are provided on a first surface of the board body 31, and the conductor layer 33 is provided on a second surface of the board body 31. The conductor layer 32 and the conductor layer 33 are electrically connected via the via interconnects 34 provided inside through holes penetrating the board body 31 from its first to its second surface. The via interconnects 34 may fill in the through holes.

The board body 31 is, for example, glass cloth impregnated with insulating resin such as epoxy resin. The board body 31 may be, for example, approximately 100 µm, to approximately 200 µm in thickness. Examples of the material of the conductor layers 32 and 33 and the via interconnects 34 include copper (Cu). Each of the conductor layers 32 and 33 may be, for example, approximately 5 µm to approximately 10 µm in thickness. The conductor layers 32 and 33 may be formed with various interconnection forming methods such as a semi-additive process and a subtractive process. The noble metal layer 35 is stacked on the upper surface of the conductor layer 32. Examples of the noble metal layer 35 include layers containing noble metals such as gold (Au) and palladium (Pd). The noble metal layer 35 may be formed with, for example, electroless plating or the like. A nickel (Ni) layer, a nickel/palladium (Ni/Pd) layer (a metal layer formed of a Ni layer and a Pd layer stacked in this order), etc., may be formed under the gold (Au) layer.

The noble metal layer 35 is provided in order to increase the reliability of connections with connection terminals 47 described below. The noble metal layer 35 is substantially greater in thickness than a common gold plating layer in order to resist pressures from the connection terminals 47 having a spring characteristic. A common gold plating layer or the like provided to increase the reliability of connections with solder balls is less than or equal to approximately 0.05 µm in thickness. On the other hand, the thickness of the noble metal layer 35, which is eight or more times the thickness of the commonly-provided gold plating layer or the like, may be, for example, approximately 0.4 µm.

The conductor layer 33 of the first relay board 30 and the conductor layer 112 of the mounting board 110 are electrically connected via the solder 120. Examples of the material of the solder 120 include an alloy containing lead (Pb); an alloy of tin (Sn) and copper (Cu); an alloy of tin (Sn) and silver (Ag); and an alloy of tin (Sn), silver (Ag), and copper (Cu). The solder 120 may be replaced with, for example, electrically conductive resin paste (such as Ag paste) or the like.

The second relay board 40 of the socket 10 includes a board body 41, conductor layers 42 and 43, via interconnects 44, solder 45, solder 46, the connection terminals 47 having a spring characteristic, and connection terminals 48 having a spring characteristic. The conductor layer 42 is provided on a first surface of the board body 41, and the conductor layer 43 is provided on a second surface of the board body 41. The conductor layer 42 and the conductor layer 43 are electrically connected via the via interconnects 44 provided inside through holes penetrating the board body 41 from its first to its second surface. The via interconnects 44 may fill in the through holes. The connection terminals 48 are fixed on the conductor layer 42 via the solder 45. Likewise, the connection terminals 47 are fixed on the conductor layer 43 via the solder 46.

The board body 41 is, for example, glass cloth impregnated with insulating resin such as epoxy resin. The board body 41 may be, for example, approximately 100 µm to approximately 200 µm in thickness. Examples of the material of the conductor layers 42 and 43 and the via interconnects 44 include copper (Cu). Each of the conductor layers 42 and 43 may be, for example, approximately 5 µm to approximately 10 µm in thickness. The conductor layers 42 and 43 may be formed with various interconnection forming methods such as a semi-additive process and a subtractive process. Examples of the material of the solder 45 and the solder 46 include an alloy containing lead (Pb); an alloy of tin (Sn) and copper (Cu); an alloy of tin (Sn) and silver (Ag); and an alloy of tin (Sn), silver (Ag), and copper (Cu). The solder 45 and the solder 46 may be replaced with, for example, electrically conductive resin paste (such as Ag paste) or the like.

The connection terminals 47 and 48 are electrically conductive terminals having a spring characteristic. Examples of the material of the connection terminals 47 and 48 include Cu alloys such as phosphor bronze and beryllium copper. The connection terminals 47 and 48 have their respective first ends fixed to the conductor layers 43 and 42 via the solder 46 and the solder 45 to be electrically connected to the conductor layers 43 and 42, respectively. A gold plating layer or the like may be provided on the conductor layers 42 and 43 in order to increase the reliability of connections with the solder 45 and the solder 46. In this case, the gold plating layer or the like may be less than or equal to approximately 0.05 µm in thickness because the gold plating layer or the like is provided where there is no need to resist pressures from connection terminals having a spring characteristic.

The connection terminals 47 have their second ends removably contacting and electrically connecting to the noble metal layer 35 of the first relay board 30. The connection terminals 48 have their second ends removably contacting and electrically connecting to a below-described noble metal layer 105 of the semiconductor package 100. That is, the frame part 20 positions and holds the first relay board 30, the second relay board 40, and the semiconductor package 100 so that the second ends of the connection terminals 47 are at positions corresponding to the noble metal layer 35 of the first relay board 30 and the second ends of the connection terminals 48 are at positions corresponding to the noble metal layer 105 of the semiconductor package 100. The connection terminals 47 and 48, which are denoted by difference reference numerals for convenience of description, may employ the same components. A description is given in detail below of the structure of the connection terminals 47 and 48.

The semiconductor package 100, which is an object of connection, includes the board 101, a semiconductor chip 102, a heat radiating plate 103, a conductor layer 104, and the noble metal layer 105. The board 101 has, for example, one or more insulating layers, one or more wiring patterns, one or more via interconnects, etc., (not graphically illustrated) formed in or on a board body containing insulating resin. The semiconductor chip 102 containing silicon is mounted on a first surface of the board 101, and the conductor layer 104 is formed on a second surface of the board 101. Examples of the material of the conductor layer 104 include copper (Cu). The conductor layer 104 may be, for example, approximately 5 µm to approximately 10 µm in thickness. The heat radiating plate 103 formed of, for example, copper (Cu) or the like is placed on the semiconductor chip 102. The heat radiating plate 103 may be omitted if the amount of heat generated by the semiconductor chip 102 is limited.

The noble metal layer 105 is stacked on the upper surface of the conductor layer 104. The material, the thickness, and the purpose of formation of the noble metal layer 105 are the same as those of the noble metal layer 35, and accordingly, a description thereof is omitted. The conductor layer 104 and the noble metal layer 105 may be, for example, multiple pads arranged like a grid on the second surface of the board 101. That is, the semiconductor package 100 is a so-called LGA (land grid array) type, and the socket 10 is a so-called LGA socket.

The lid part 130 is placed on the semiconductor package 100. The lid part 130 is, for example, a substantially rectangular or substantially frame-like member formed of a metal. The lid part 130 is rotatably attached to the upper surface 20A of the frame part 20 on its first end side, and has a lock mechanism on the second end side of the upper surface 20A. As illustrated in FIG. 2, by fixing (locking) the lid part 130 so that its outer edge part is in contact with the upper surface 20A of the frame part 20, the connection terminals 47 and 48 are compressed in the Z-axis directions to generate predetermined spring pressures, so that it is ensured that the semiconductor package 100 is electrically connected to the first relay board 30 via the second relay board 40. That is, the semiconductor package 100, which is an object of connection, is electrically connected to the mounting board 110 via the socket 10. It is possible to detach and reattach the semiconductor package 100 and the second relay board 40 by unlocking the lid part 130.

The lid part 130 may be a separate body from the frame part 20. In this case, for example, the lid part 130 may be so structured as to be fixable to the frame part 20 while pressing the semiconductor package 100 from above.

The socket 10, which has the connection terminals 47 and 48 having a spring characteristic provided on the respective sides of the board body 41 of the second relay board 40, has a structure without a housing that causes warpage. Therefore, it is possible to provide a socket that is less likely to warp. By preventing the occurrence of warpage, it is possible to increase the reliability of the connection between the semiconductor package 100 and the mounting board 110. Further, the second relay board 40 is configured to be detachable and reattachable without being fixed to the adjacent first relay board 30 or semiconductor package 100 with solder or the like. This facilitates replacement of the second relay board 40 with a good product in such a case as when the connection terminals 47 or 48 are broken.

Further, the connection is not sufficiently reliable if the connection terminals 47 having a spring characteristic are caused to come into direct contact with the conductor layer 112 of the mounting board 110 such as a motherboard, having no noble metal layer provided on its surface, without providing the first relay board 30. According to this embodiment, however, the first relay board 30 is connected to the mounting board 110 such as a motherboard with the solder 120, so that the connection terminals 47 having a spring characteristic come into contact with the noble metal layer 35 of the first relay board 30. Therefore, it is possible to achieve high connection reliability.

Figure 5:
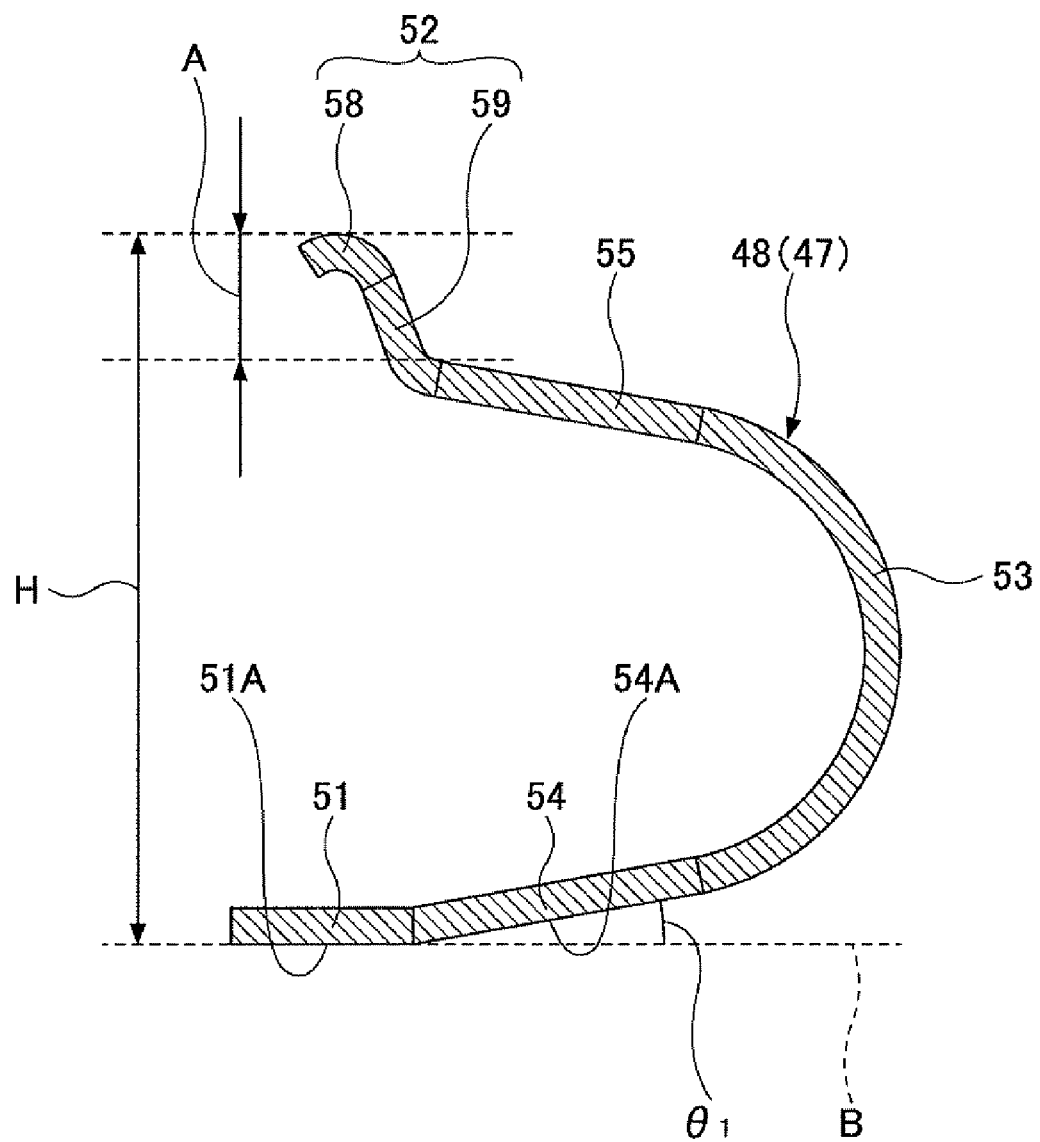
FIG. 5 is a cross-sectional view of a connection terminal according to the first embodiment.

Here, a description is given in detail, with reference to FIG. 5, of the structure of the connection terminals 48. The connection terminals 47, whose reference numeral is indicated in parentheses for convenience in FIG. 5, are the same components as the connection terminals 48. Accordingly, a description of the structure of the connection terminals 47 is omitted.

Referring to FIG. 5, the connection terminal 48, which has a spring characteristic, includes a first connecting part 51, a second connecting part 52, a spring part 53, a first supporting part 54, and a second supporting part 55. The first connecting part 51 has a plate shape. The first connecting part 51 may be, for example, 0.08 mm in thickness.

The second connecting part 52 is at such a position as to face the first connecting part 51 above the first connecting part 51. The second connecting part 52 is electrically connected to the first connecting part 51 via the spring part 53, the first supporting part 54, and the second supporting part 55. The second connecting part 52 includes a contact part 58 and a projecting part 59.

The contact part 58 is, for example, a part (of the connection terminal 48) to come into contact with the noble metal layer 105 of the semiconductor package 100. The contact part 58 is configured to move primarily in a thickness direction of the semiconductor package 100 (the downward Z-axis direction in FIG. 2) when the connection terminal 48 is pressed. The contact part 58 has a round shape. By thus rounding the shape of the contact part 58, it is possible to prevent the contact part 58 from breaking the noble metal layer 105 when the contact part 58 is pressed into contact with the noble metal layer 105.

Further, for example, when the semiconductor package 100 presses the second connecting part 52, the contact part 58 comes into contact with the noble metal layer 105 with the second connecting part 52 being moved in a direction to approach the first connecting part 51 (the downward Z-axis direction in FIG. 2) through deformation of the spring part 53. This allows the second connecting part 52 to come into contact with the noble metal layer 105 without a substantial movement in a direction parallel to a plane in which the noble metal layer 105 is formed. Therefore, it is possible to arrange the pads of the noble metal layer 105 and the conductor layer 104 at narrow pitches.

The projecting part 59 has a first end portion formed unitarily with the second supporting part 55 and has a second end portion formed unitarily with the contact part 58. The projecting part 59 projects in a direction toward the noble metal layer 105 (in a direction away from the first connecting part 51) from the second supporting part 55.

By thus providing the projecting part 59, formed unitarily with the contact part 58 and the second supporting part 55 and projecting in a direction toward the noble metal layer 105 (in a direction away from the first connecting part 51) from the second supporting part 55, between the contact part 58 and the second supporting part 55, it is possible to prevent contact of the noble metal layer 105 and the second supporting part 55 due to deformation of the spring part 53 caused by the semiconductor package 100 or the like pressing the contact part 58. Therefore, it is possible to prevent breakage of the connection terminal 48 and the noble metal layer 105.

The amount of projection A (indicated by arrows in FIG. 5) of the second connecting part 52 (the amount of projection with reference to the connection of the second supporting part 55 and the projecting part 59) in a state where there is no contact between the noble metal layer 105 and the second connecting part 52 may be, for example, 0.3 mm. Further, the second connecting part 52 may be, for example, 0.08 mm in thickness.

The spring part 53, which is interposed between the first supporting part 54 and the second supporting part 55, is formed unitarily with the first supporting part 54 and the second supporting part 55. The spring part 53, which has a curved shape (such as a C-letter shape), has a spring characteristic.

The spring part 53 is configured to cause the second connecting part 52 and the noble metal layer 105 to come into contact without fixing the second connecting part 52 and the noble metal layer 105 by pushing back the second connecting part 52 toward the noble metal layer 105 when the second connecting part 52 is pressed by the semiconductor package 100 or the like. The width and the thickness of the spring part 53 may be the same as, for example, the width and the thickness, respectively, of the second connecting part 52. In the connection terminal 48 of this embodiment, in practice, the second connecting part 52, the spring part 53, the first supporting part 54, and the second supporting part 55 serve as a spring as a unit. The spring constant of a portion of the connection terminal 48 corresponding to the second connecting part 52, the spring part 53, the first supporting part 54, and the second supporting part 55 may be, for example, 0.6 N/mm to 0.8 N/mm.

The first supporting part 54 is interposed between the spring part 53 and the first connecting part 51. The first supporting part 54 has a first end portion formed unitarily with a first end portion of the spring part 53 and has a second end portion formed unitarily with the first connecting part 51. The first supporting part 54 has a plate shape.

The first supporting part 54 is configured so that an angle $\theta_1$ formed by a plane B including a surface 51A of the first connecting part 51 on the side opposed to the board body 41 of the second relay board 40 and a surface 54A of the first supporting part 54 on the side opposed to the board body 41 of the second relay board 40 is an acute angle. The angle $\theta_1$ may be, for example, 5 to 15 degrees.

By thus causing the angle $\theta_1$ to be an acute angle, it is possible to prevent contact of the first supporting part 54 and other parts of the second relay board 40 due to deformation of the spring part 53 caused by the semiconductor package 100 or the like pressing the contact part 58. Therefore, it is possible to prevent breakage of the connection terminal 48 and other parts of the second relay board 40. The width and the thickness of the first supporting part 54 may be the same as, for example, the width and the thickness, respectively, of the second connecting part 52.

The second supporting part 55 is interposed between the spring part 53 and the second connecting part 52. The second supporting part 55 has a first end portion formed unitarily with a second end portion of the spring part 53 and has a second end portion formed unitarily with the projecting part 59 of the second connecting part 51. The second supporting part 55 has a plate shape. The width and the thickness of the second supporting part 55 may be the same as, for example, the width and the thickness, respectively, of the second connecting part 52.

The connection terminal 48 may be manufactured by, for example, performing stamping on a metal plate (for example, a plate of a Cu alloy) (not graphically illustrated); thereafter forming a Ni plating film (for example, 1 µm to 3 µm in thickness) on the entire surface of a stamped-out metal plate (a stamped-out portion of the metal plate); then forming a Au plating film (for example, 0.3 µm to 0.5 µm in thickness) on the Ni plating film formed on parts corresponding to the first connecting part 51 and the contact part 58 (that is, forming a Au plating film partially on the Ni plating film); and bending the stamped-out metal plate on which the Ni plating film and the Au plating film are formed. Examples of the Cu alloy used as the material of the metal plate include phosphor bronze and beryllium copper.

The body (not graphically illustrated) of the above-described connection terminal 48 may be formed by etching a metal plate (for example, a plate of a Cu alloy) (not graphically illustrated) and thereafter bending the etched metal plate. A height H of the connection terminal 48 in the state illustrated in FIG. 5 (where the second connecting part 52 of the connection terminal 48 is not pressed) may be, for example, 1.5 mm.

Next, a description is given, with reference to FIGS. 6A through 6F, of a method of connecting the semiconductor package 100 and the mounting board 110 using the socket 10.

Figure 6A:
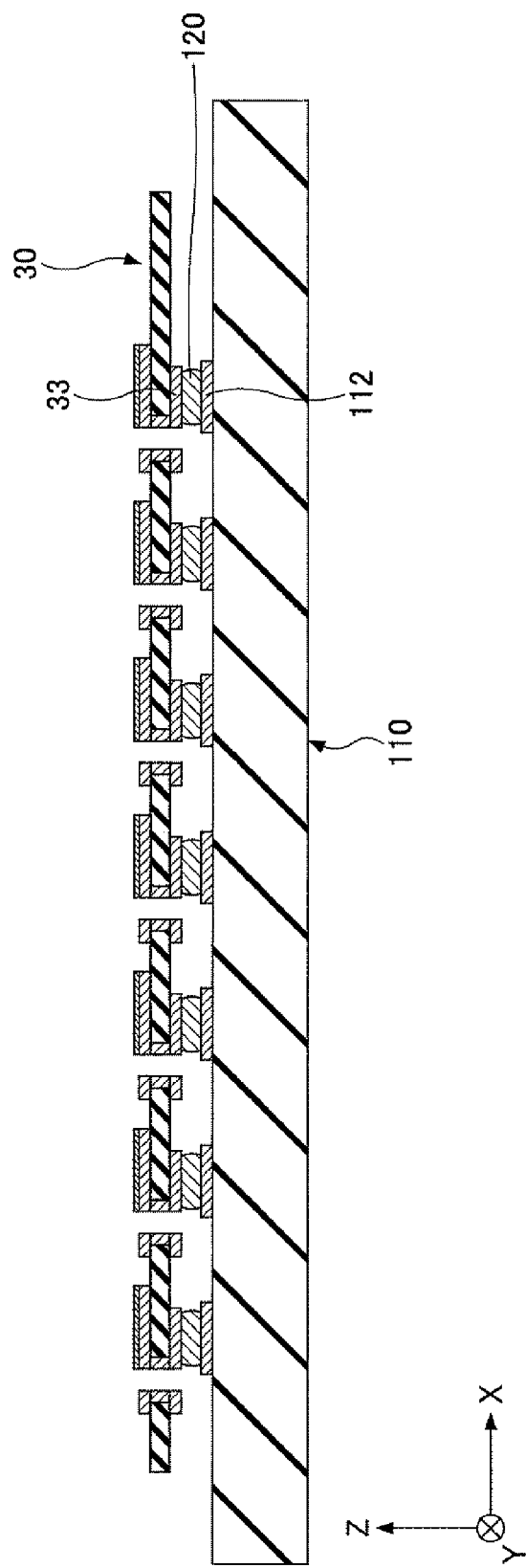

First, as illustrated in FIG. 6A, the mounting board 110 and the first relay board 30 are prepared. Then, the mounting board 110 and the first relay board 30 are electrically connected via the solder 120. For example, solder paste is applied to each of the conductor layer 112 of the mounting board 110 and the conductor layer 33 of the first relay board 30, and the conductor layer 112 and the conductor layer 33 are opposed to cause the solder paste applied to the conductor layer 112 and the solder paste applied to the conductor layer 33 to come into contact with each other. Then, the solder paste is melted by being heated to, for example, 230° C., thereby forming the solder 120.

Next, as illustrated in FIG. 6B, the frame part 20 is prepared. Then, the frame part 20 is so pushed into the mounting board 110 side as to surround the first relay board 30, so that the third positioning and holding part 23 of the frame part 20 is press-fit to the first relay board 30. As a result, the lower surface 20D of the frame part 20 and the interior surface 23A of the third positioning and holding member 23 come into contact with and are fixed to the outer edge part of the upper surface and the side surfaces, respectively, of the first relay board 30. At this point, the bottom surface 23B of the third positioning and holding part 23 comes into contact with the upper surface of the mounting board 110. Therefore, the third positioning and holding part 23 serves as a stopper to make it possible to prevent the frame part 20 from being excessively pressed toward the mounting board 110 side to damage the solder 120, etc. The frame part 20 may be manufactured by, for example, a known mold injection process using resin, punching or cutting using metal, etc.

The process of FIG. 6A and the process of FIG. 6B may be reversed in order. That is, the third positioning and holding part 23 of the frame part 20 may be press-fit to the first relay board 30, and thereafter, the first relay board 30, together with the frame part 20, may be subjected to reflowing to be electrically connected to the mounting board 110 via the solder 120.

Figure 6C:
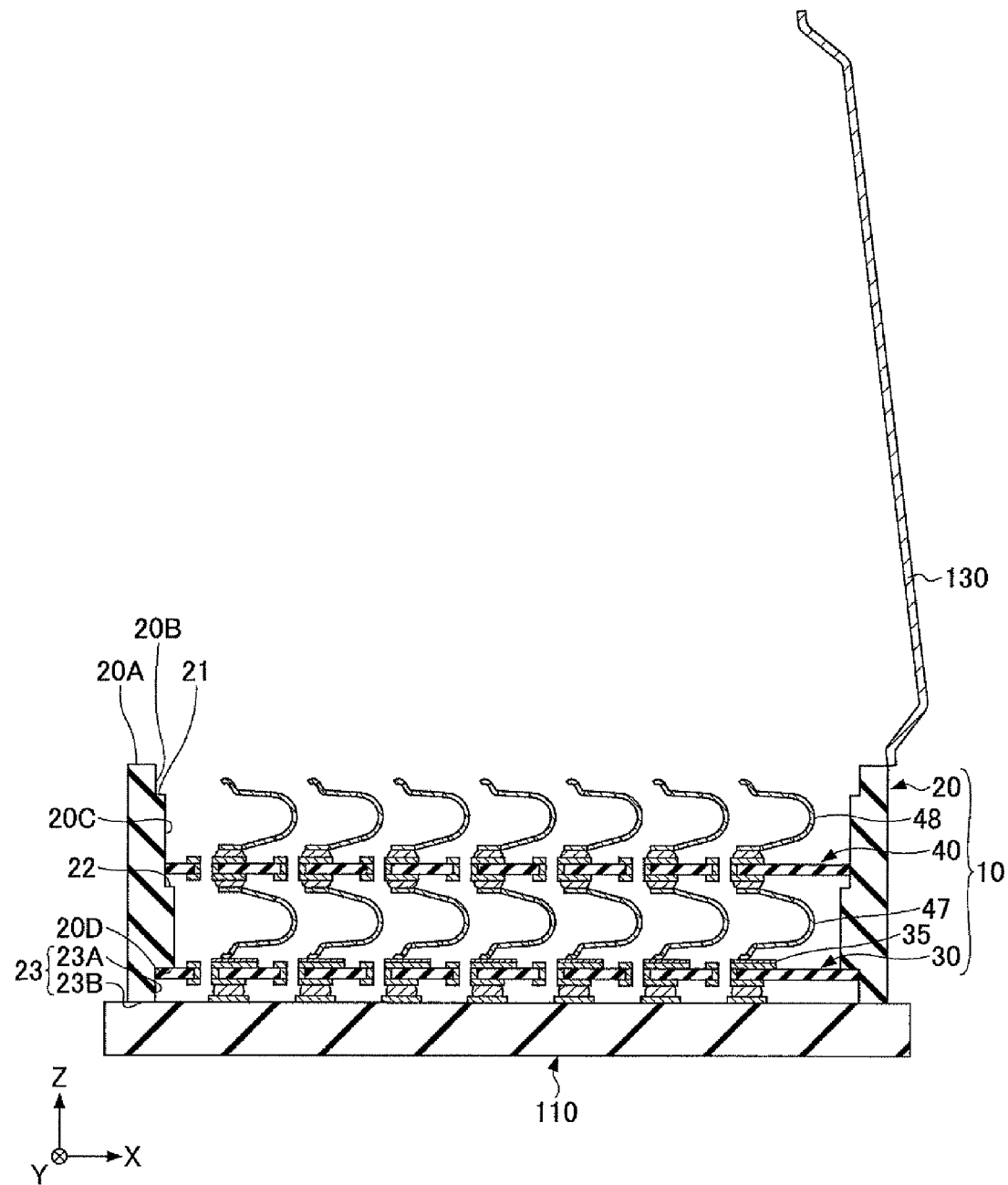
Figure 6D:
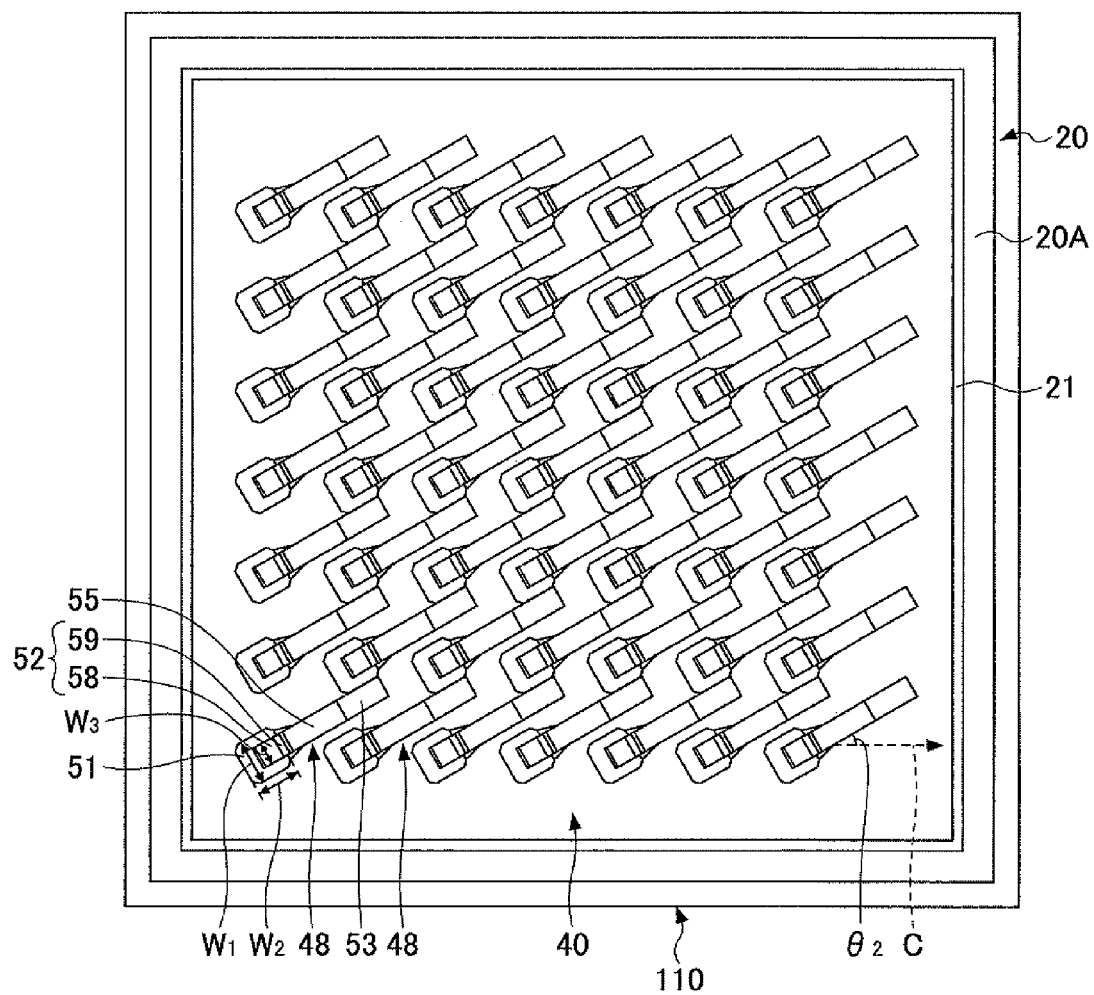

Next, as illustrated in FIG. 6C (a cross-sectional view) and FIG. 6D (a plan view), the second relay board 40 is prepared. The lid part 130 is so rotated as to allow placement of the second relay board 40. Then, the second relay board 40 is placed so that the outer edge part of the lower surface of the second relay board 40 faces the second positioning and holding part 22 and the side surfaces of the second relay board 40 are supported by the interior surface 20C. At this point, however, the connection terminals 47 and 48 are not pressed, so that the outer edge part of the lower surface of the second relay board 40 is not in contact with the second positioning and holding part 22. The first relay board 30 and the second relay board 40 are aligned by the frame part 20, and the second connecting parts 52 of the connection terminals 47 come into contact with the noble metal layer 35 of the first relay board 30.

According to this embodiment, in the second relay board 40, the connection terminals 47 and 48 are so arranged as to form a given angle $\theta_2$ relative to their respective arrangement directions C (FIG. 6D). In other words, the connection terminals 47 and 48 are arranged with an inclination relative to their respective arrangement directions C. The given angle $\theta_2$ may be, for example, 25 degrees to 35 degrees. Each of a width $W_1$ and a width $W_2$ of the first connecting part 51 may be, for example, 0.4 mm. Further, a width $W_3$ of the second connecting part 52 may be, for example, 0.2 mm.

By thus arranging the connection terminals 47 and 48 with an inclination relative to their respective arrangement directions C, it is possible to arrange more connection terminals 47 and 48 per unit area than in the case of arranging the connection terminals 47 and 48 parallel to their respective arrangement directions C. As a result, it is possible for the pieces (or pads) of the noble metal layers 35 and 105 to contact the connection terminals 47 and 48, respectively, at narrow pitches. However, the arrangement of the connection terminals 47 and 48 is not limited to the one illustrated in FIG. 6D, and the connection terminals 47 and 48 may be arranged, for example, parallel to their respective arrangement directions C.

Referring to FIG. 2 and FIG. 3 as well, a description is given of manufacturing the second relay board. The second relay board 40 may be manufactured as follows. That is, by a known method, the board body 41 having the conductor layers 42 and 43 and the via interconnects 44 is manufactured. Then, solder paste is applied to each of the conductor layers 42 and 43. The conductor layers 42 and 43 and the connection terminals 47 and 48 are positioned using a jig, and the respective first ends of the connection terminals 48 and 47 are caused to contact the solder paste applied to the conductor layer 42 and the solder paste applied to the conductor layer 43, respectively. Then, the solder paste is melted by being heated to, for example, 230° C., so that the solder 45 and the solder 46 are formed.

Figure 6E:
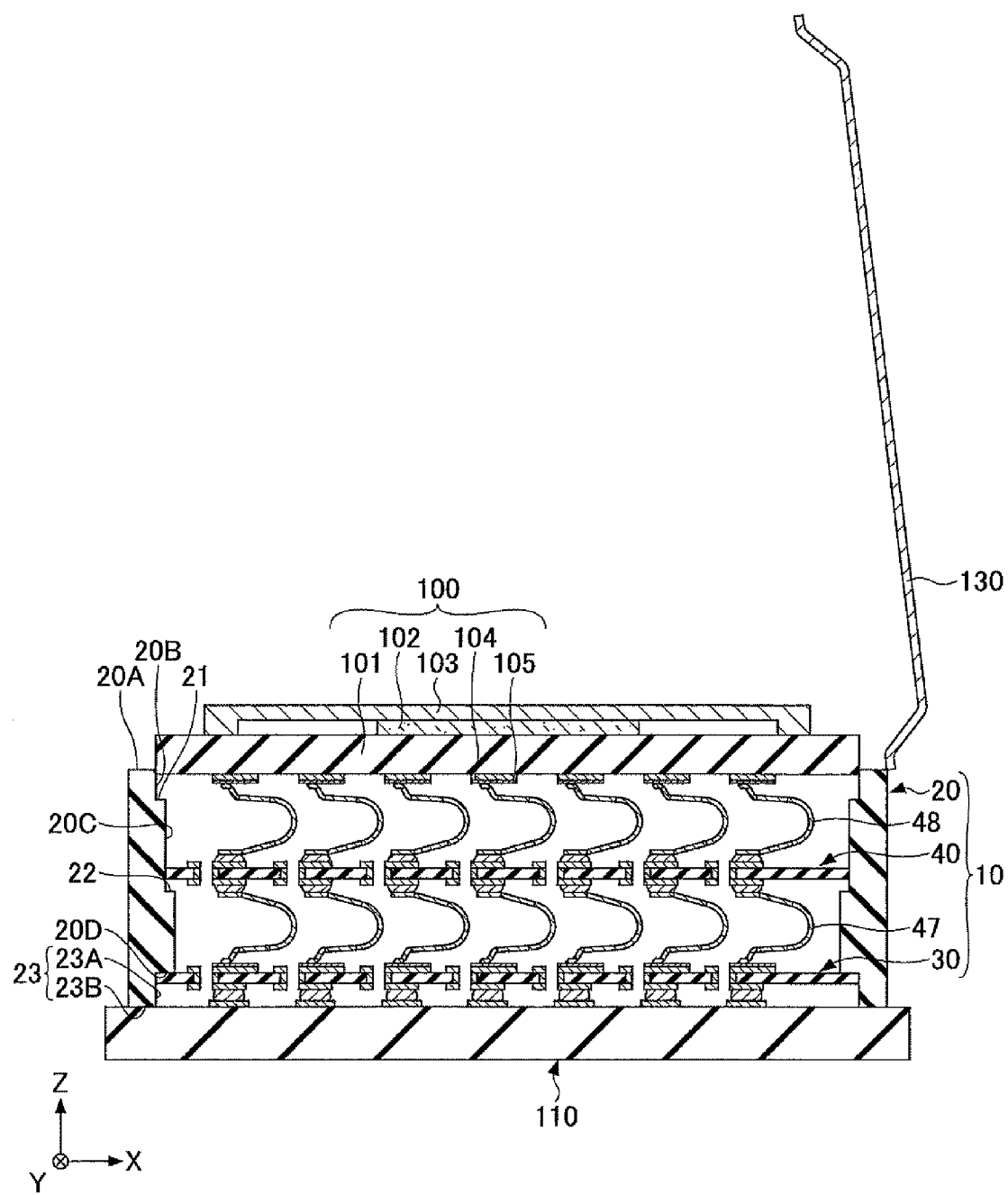

Next, as illustrated in FIG. 6E, the semiconductor package 100 is prepared. Then, the semiconductor package 100 is placed so that the outer edge part of the lower surface of the board 101 of the semiconductor package 100 faces the first positioning and holding part 21 and the side surfaces of the board 101 are supported by the interior surface 20B. At this point, however, since the connection terminals 47 and 48 are not pressed, the outer edge part of the lower surface of the board 101 is not in contact with the first positioning and holding part 21. The semiconductor package 100 and the second relay board 40 are aligned by the frame part 20, and the second connecting parts 52 of the connection terminals 48 come into contact with the noble metal layer 105 of the semiconductor package 100.

Figure 6F:
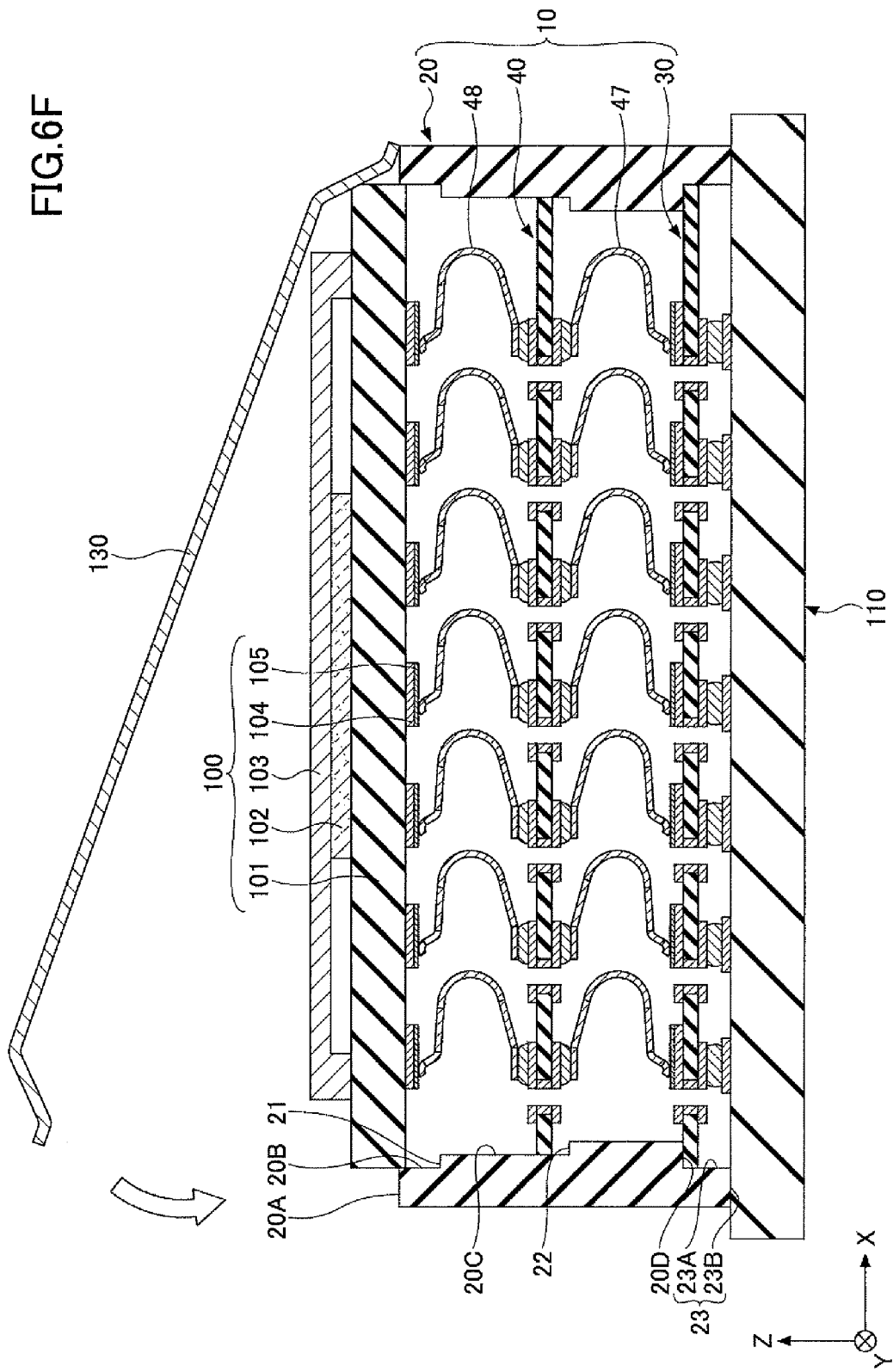

Next, as illustrated in FIG. 6F, the lid part 130 is rotated in the direction indicated by an arrow to push in the semiconductor package 100 to the mounting board 110 side, and is fixed (locked) so that the outer edge part of the lid part 130 comes into contact with the upper surface 20A of the frame part 20. As a result, the connection terminals 47 and 48 are compressed in the Z-axis directions to generate predetermined spring pressures, so that it is ensured that the semiconductor package 100 is electrically connected to the first relay board 30 via the second relay board 40 (FIG. 2). That is, the semiconductor package 100 is electrically connected to the mounting board 110 via the socket 10.

Since the semiconductor package 100 is held by the first positioning and holding part 21, the semiconductor package 100 is prevented from being pressed into the mounting board 110 side beyond the first positioning and holding part 21. Thus, the first positioning and holding part 21 serves also as a stopper to prevent the semiconductor package 100 from being pressed in more than required to cause the connection terminals 48 to deform more than required to be broken. Further, the second relay board 40 is held by the second positioning and holding part 22. Therefore, the second relay board 40 is prevented from being pushed into the mounting board 110 side beyond the second positioning and holding part 22. Thus, the second positioning and holding part 22 serves also as a stopper to prevent the second relay board 40 from being pressed in more than required to cause the connection terminals 47 to deform more than required to be broken.

Thus, according to the first embodiment, in a socket for electrically connecting an object of connection such as a semiconductor package to a mounting board such as a motherboard, the socket including a frame part, a first relay board, and a second relay board, the first relay board is connected onto the mounting board, and connection terminals having a spring characteristic come into contact with the noble metal layer of the first relay board. Therefore, high connection reliability is obtained. (It is not possible to obtain sufficient connection reliability by causing connection terminals having a spring characteristic to come into direct contact with a conductor layer (pads) of the mounting board, the conductor layer having no noble metal layer provided on its surface, without providing the first relay board.)

Further, the socket has connection terminals with a spring characteristic provided on each side of the board body of the second relay board so as to have a structure without a housing that causes warpage. Therefore, it is possible to provide a socket that is less likely to warp. By preventing the occurrence of warpage, it is possible to increase the reliability of the connection between the semiconductor package and the mounting board.

Further, the second relay board is configured to be detachable and reattachable without being fixed to the adjacent first relay board or semiconductor package with solder or the like. This facilitates replacement of the second relay board with a good product in such a case as when the connection terminals are broken.

Further, manufacturing the first relay board using the same material or a material having the same coefficient of thermal expansion as that of the mounting board (at least as a principal component) results in the first relay board and the mounting board having the same coefficient of thermal expansion. Therefore, the first relay board warps in the same direction as the mounting board even if the mounting board warps. Thus, it is possible to increase the reliability of the connection between the first relay board and the mounting board.

Next, a description is given of a variation of the first embodiment.

In this variation of the first embodiment, a case is illustrated where the frame part 20 is replaced with a frame part 60. Cross-sectional views according to this variation are the same as those of FIG. 2 and FIG. 3. The same elements as those of the first embodiment are referred to by the same reference numerals, and a description thereof is omitted.

Figure 7A:
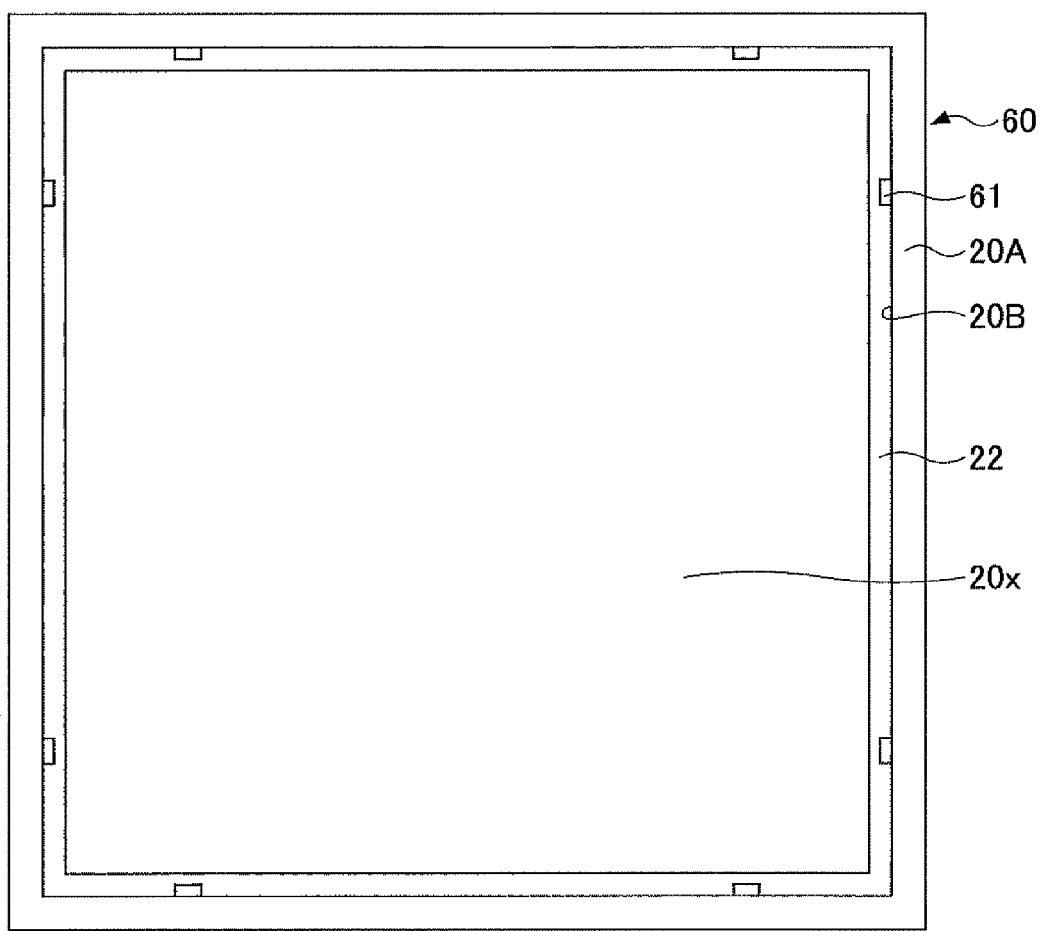
FIG. 7A is a plan view of a frame part of the socket according to a variation of the first embodiment.
Figure 7B:
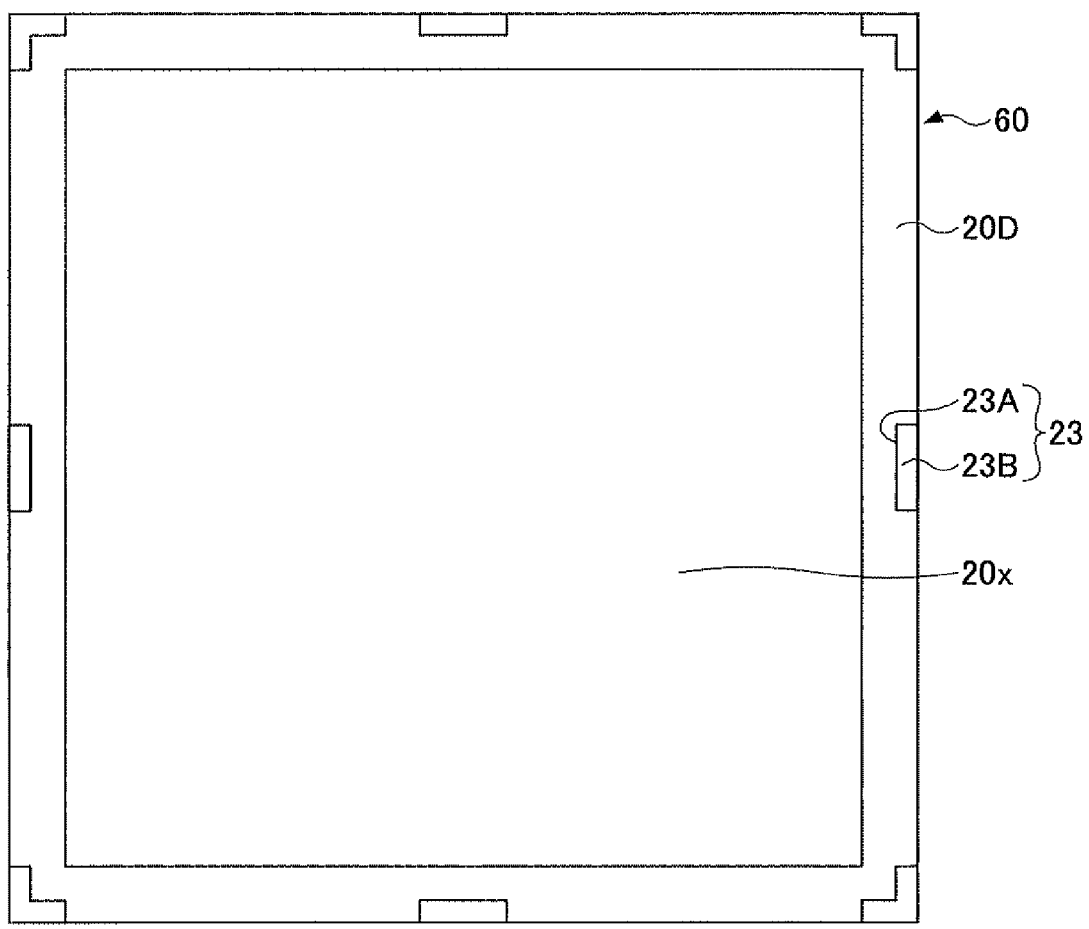
FIG. 7B is a bottom view of the frame part of the socket according to the variation of the first embodiment.
Figure 7C:
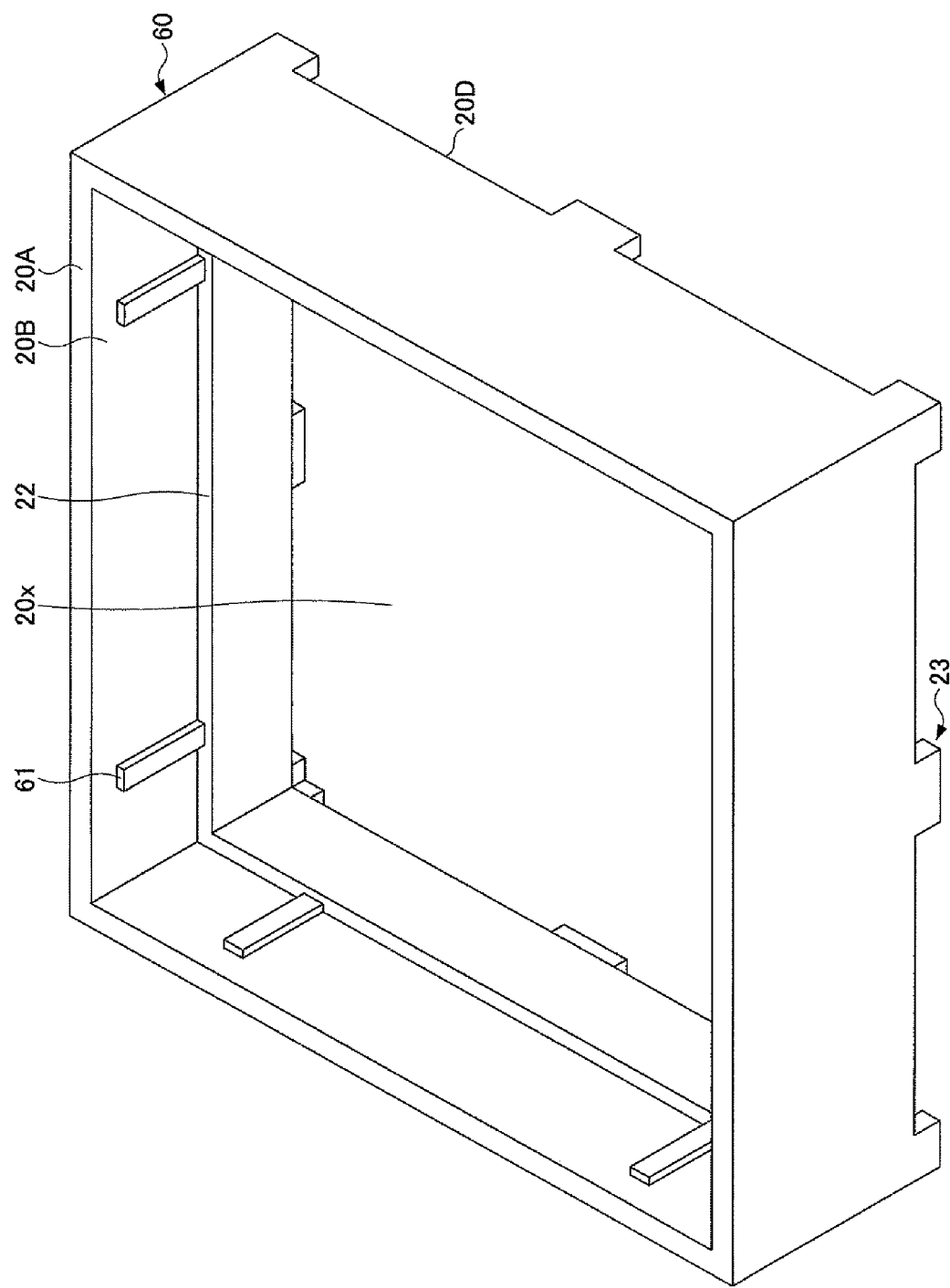
FIG. 7C is a perspective view of the frame part of the socket according to the variation of the first embodiment.

FIGS. 7A, 7B, and 7C are diagrams illustrating the frame part 60 of the socket 10 according to the variation of the first embodiment. FIGS. 7A through 7C are a (top) plan view, a bottom view, and a perspective view, respectively, of the frame part 60. Referring to FIGS. 7A through 7C, the frame part 60 has the same configuration as the frame part 20 of the first embodiment except that the first positioning and holding part 21 is replaced with a first positioning and holding part 61.

In the first embodiment, the first positioning and holding part 21 may be a surface provided like a frame at a position inside and one step lower than the upper surface 20A of the frame part 20. On the other hand, according to the variation of the first embodiment, the first positioning and holding part 61 may be a partial surface provided at a position inside and one step lower than the upper surface 20A of the frame part 60. For example, the surface may be defined by multiple projections formed on the interior surface 20B of the frame part 60.

The first positioning and holding part 61 is in contact with the outer edge part of the lower surface of the board 101 of the semiconductor package 100. The shape of the opening defined by the interior surface 20B is rectangular in accordance with the planar shape of the semiconductor package 100. Further, the opening defined by the interior surface 20B is slightly larger than the outer shape of the board 101 so as to allow attachment and detachment of the semiconductor package 100. The interior surface 20B and the side surfaces of the board 101 may be either in contact or separated by such a gap as to cause no misalignment between the second relay board 40 and the semiconductor package 100.

Figure 8:
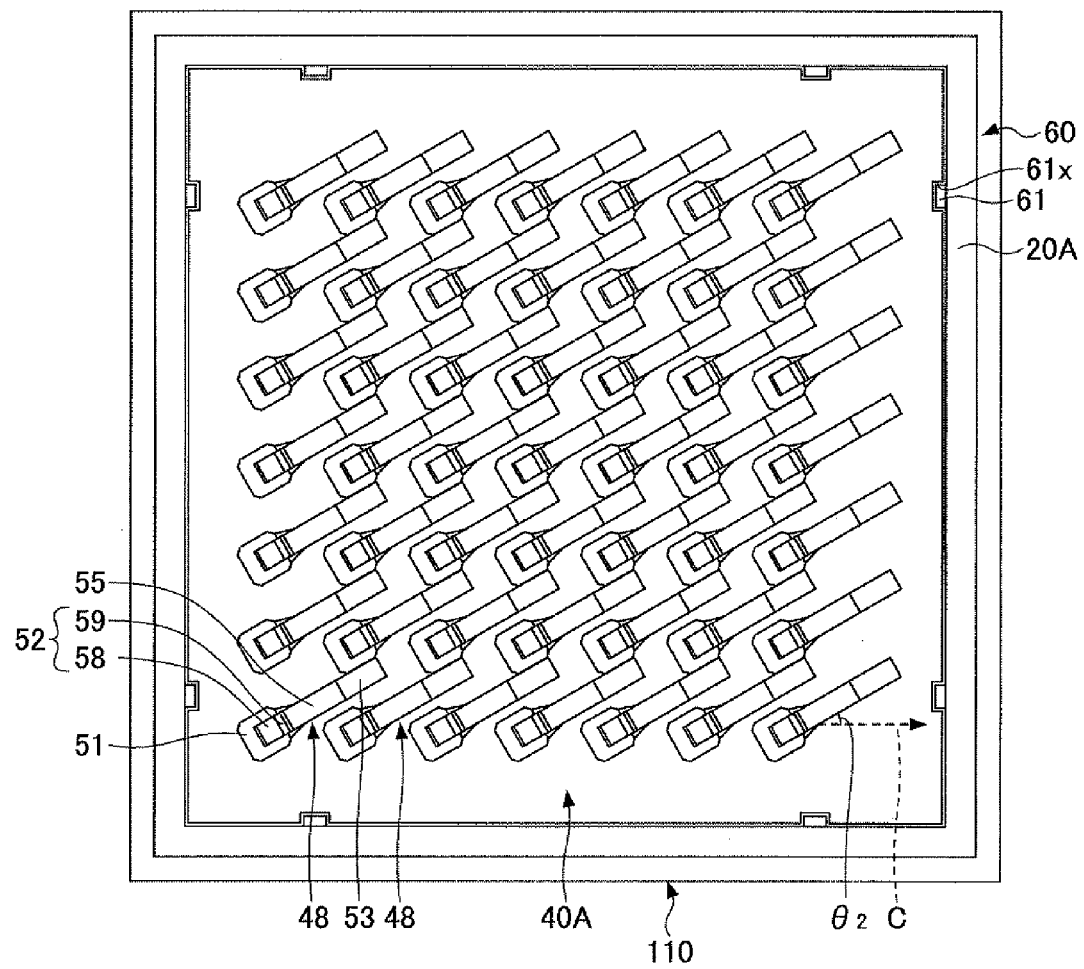
FIG. 8 is a plan view of a second relay board according to the variation of the first embodiment.

The outer shape of the second relay board 40 may be the same as in the first embodiment. Alternatively, as illustrated in FIG. 8, a second relay board 40A having cut parts 61x provided in its periphery (outer edge part) may be used. The cut parts 61x have a shape corresponding to that of (the projections of) the first positioning and holding part 61. Adopting such a shape as that of the second relay board 40A makes it possible to have a maximum outer shape larger than the second relay board 40. Therefore, it is possible to place the connection terminals 48 closer to the outer edge part. This makes it possible to deal with the case where the pads of the conductor layer 104 and the noble metal layer 105 of the semiconductor package 100 are placed closer to the outer edge part.

Thus, according to the variation of the first embodiment, the same effects as those of the first embodiment are produced. In addition, the following effect is produced. That is, it is possible to establish a suitable connection also to a semiconductor package where pads (the conductor layer 104 and the noble metal layer 105) are placed closer to the outer edge part.

[b] Second Embodiment

In a second embodiment, a socket 10B is illustrated that does not employ the second relay board 40.

Figure 9:
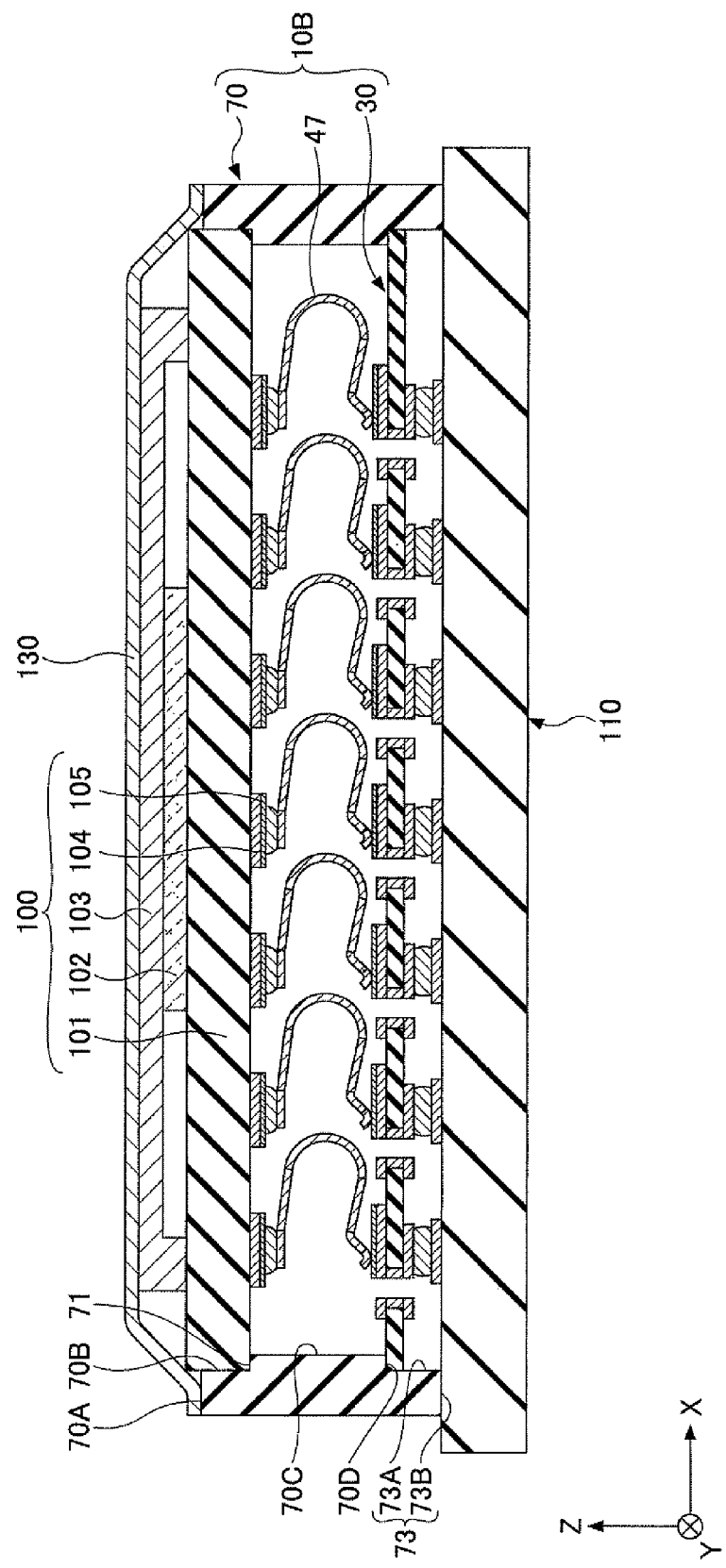
FIG. 9 is a cross-sectional view of a socket according to a second embodiment.
Figure 10:
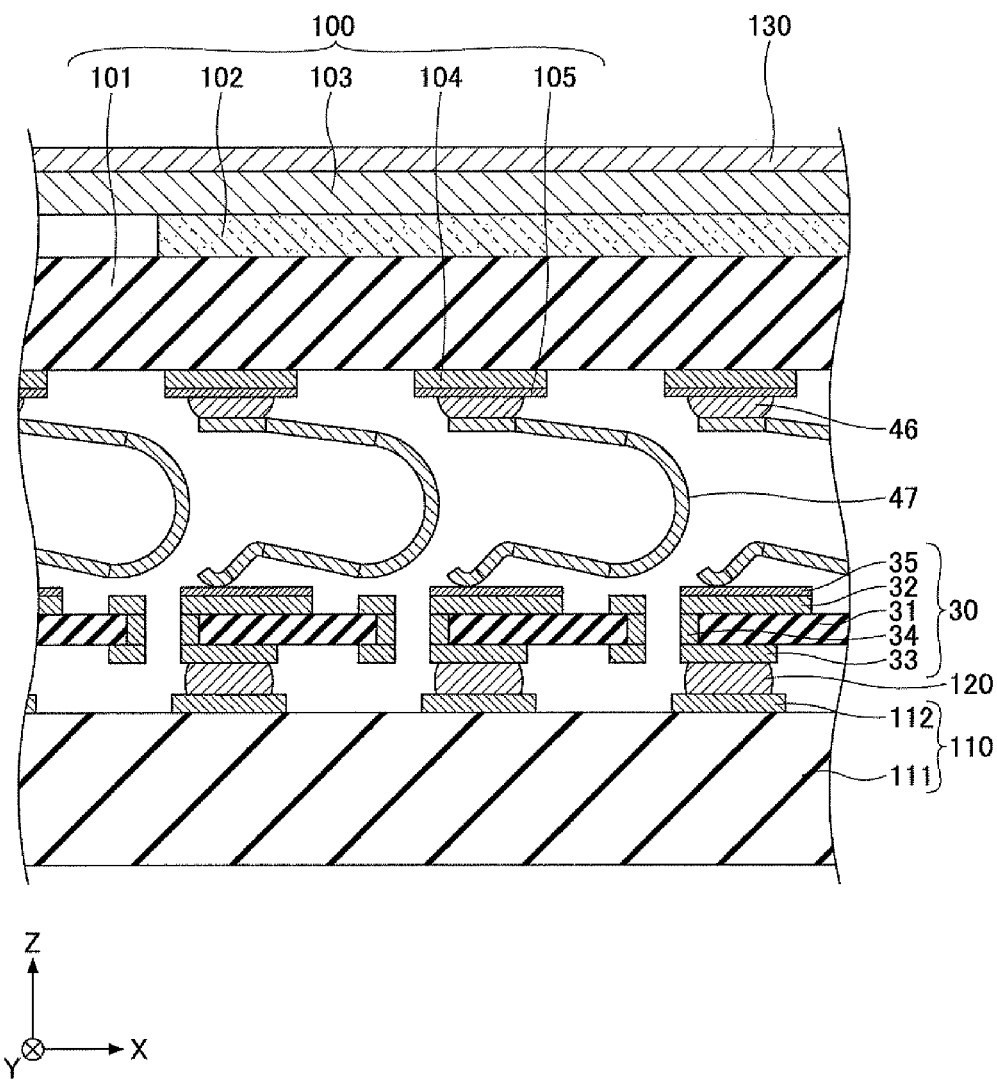
FIG. 10 is an enlarged view of part of FIG. 9 according to the second embodiment.

FIG. 9 is a cross-sectional view of the socket 10B according to the second embodiment. FIG. 10 is an enlarged view of part of FIG. 9. Referring to FIG. 9 and FIG. 10, the socket 10B includes a frame part 70 and the first relay board 30. The semiconductor package 100 is electrically connected to the mounting board 110 via the socket 10B.

The frame part 70 is a frame-shaped member having an opening in the center, and includes a first positioning and holding part 71 and a second positioning and holding part 73. The frame part 70 is formed of resin, metal, etc. The frame part 70 is configured to position and hold and further align the first relay board 30 and the semiconductor package 100. Further, the frame part 70 is configured to prevent the interval between the first relay board 30 and the semiconductor package 100 from being less than or equal to a predetermined value. The frame part 70 has no part corresponding to the second positioning and holding part 22 of the frame part 20 of the first embodiment because unlike the frame part 20, the frame part 70 is not required to hold the second relay board 40.

The first positioning and holding part 71 may be a surface provided like a frame at a position inside and one step lower than an upper surface 70A of the frame part 70. The first positioning and holding part 71 is in contact with an outer edge part of the lower surface of the board 101 of the semiconductor package 100. The frame part 70 includes a four-sided interior surface 70B. The shape of the opening defined by the interior surface 70B is rectangular in accordance with the planar shape of the semiconductor package 100. Further, the opening defined by the interior surface 70B is slightly larger than the outer shape of the board 101 so as to allow attachment and detachment of the semiconductor package 100. The interior surface 70B and the side surfaces of the board 101 may be either in contact or separated by such a gap as to cause no misalignment between the first relay board 30 and the semiconductor package 100.

The second positioning and holding part 73 may be multiple projecting parts so provided on an outer edge part of a lower surface 70D of the frame part 70 as to project from the lower surface 70D. The first relay board 30 is press-fit into the second positioning and holding part 73, so that the lower surface 70D of the frame part 70 and an interior surface 73A (of the projecting parts) of the second positioning and holding part 73 are in contact with an outer edge part of the upper surface and the side surfaces, respectively, of the first relay board 30. The shape of the opening defined by the interior surface 73A is rectangular in accordance with the planar shape of the first relay board 30. Further, the shape of the opening defined by the interior surface 73A is substantially the same as the outer shape of the first relay board 30 so as to allow press-fitting of the first relay board 30. The vertical distance from the lower surface 70D of the frame part 70 to a bottom surface 73B (of the projecting parts) of the second positioning and holding part 73 is substantially the same as the vertical distance from the upper surface of the mounting board 110 to the upper surface of the first relay board 30. The bottom surface 73B of the second positioning and holding part 73 is in contact with the mounting board 110.

The connection terminals 47 are fixed onto the noble metal layer 105 of the semiconductor package 100 via the solder 46. Like the connection terminals 48 illustrated in FIG. 6D, the connection terminals 47 may be arranged with an inclination relative to a direction of their arrangement. In this embodiment, the noble metal layer 105 and the connection terminals 47 are connected with the solder 46. Therefore, the thickness of the noble metal layer 105 may be less than or equal to approximately 0.05 µm, which is sufficient to increase the reliability of a connection with the solder 46. That is, since there is no need for the noble metal layer 105 to resist pressures from the connection terminals 47 having a spring characteristic, the noble metal layer 105 does not have to be as great in thickness as approximately 0.4 µm. Alternatively, the noble metal layer 105 may be omitted.

The lid part 130 is placed on the semiconductor package 100. The lid part 130 is, for example, a substantially rectangular or substantially frame-like member formed of a metal. The lid part 130 is rotatably attached to the upper surface 70A of the frame part 70 on its first end side, and has a lock mechanism on the second end side of the upper surface 70A. As illustrated in FIG. 9, by fixing (locking) the lid part 130 so that its outer edge part is in contact with the upper surface 70A of the frame part 70, the connection terminals 47 are compressed in the Z-axis directions to generate predetermined spring pressures, so that it is ensured that the semiconductor package 100 is electrically connected to the first relay board 30. That is, the semiconductor package 100, which is an object of connection, is electrically connected to the mounting board 110 via the socket 10B. It is possible to detach and reattach the semiconductor package 100 by unlocking the lid part 130.

The lid part 130 may be a separate body from the frame part 70. In this case, for example, the lid part 130 may be so structured as to be fixable to the frame part 70 while pressing the semiconductor package 100 from above.

Figure 11B:
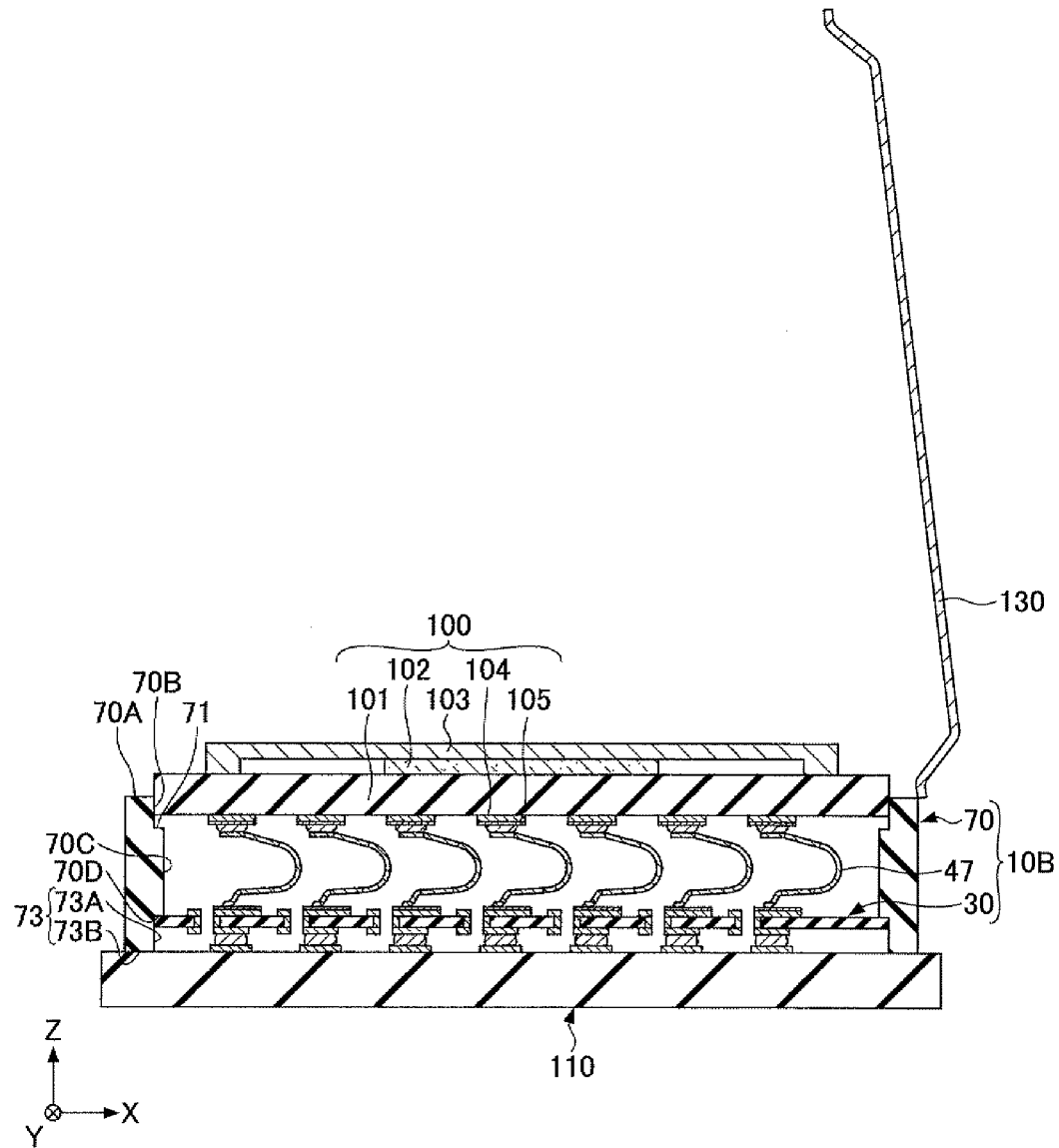

Next, a description is given, with reference to FIGS. 11A through 11C, of a method of connecting the semiconductor package 100 and the mounting board 110 using the socket 10B.

First, as in the process of FIG. 6A of the first embodiment, the mounting board 110 and the first relay board 30 are prepared. Then, the mounting board 110 and the first relay board 30 are electrically connected via the solder 120.

Next, as illustrated in FIG. 11A, the frame part 70 is prepared. Then, the frame part 70 is so pushed into the mounting board 110 side as to surround the first relay board 30, so that the second positioning and holding part 73 of the frame part 70 is press-fit to the first relay board 30. As a result, the lower surface 700 of the frame part 70 and the interior surface 73A of the second positioning and holding member 73 come into contact with and are fixed to the outer edge part of the upper surface and the side surfaces, respectively, of the first relay board 30. At this point, the bottom surface 73B of the second positioning and holding part 73 comes into contact with the upper surface of the mounting board 110. Therefore, the second positioning and holding part 73 serves as a stopper to make it possible to prevent the frame part 70 from being excessively pressed toward the mounting board 110 side to damage the solder 120, etc. The frame part 70 may be manufactured by, for example, a known mold injection process using resin, punching or cutting using metal, etc. Like in the first embodiment, the process of FIG. 6A and the process of FIG. 11A may be reversed in order.

Next, as illustrated in FIG. 11B, the semiconductor package 100 having the connection terminals 47 fixed onto the noble metal layer 105 via the solder 46 is prepared. The lid part 130 is so rotated as to allow placement of the semiconductor package 100. Then, the semiconductor package 100 is placed so that the outer edge part of the lower surface of the board 101 of the semiconductor package 100 faces the first positioning and holding part 71 and the side surfaces of the board 101 are supported by the interior surface 70B. At this point, however, the connection terminals 47 are not pressed, so that the outer edge part of the lower surface of the board 101 is not in contact with the first positioning and holding part 71. The semiconductor package 100 and the first relay board 30 are aligned by the frame part 70, and the second connecting parts 52 of the connection terminals 47 come into contact with the noble metal layer 35 of the first relay board 30.

Next, as illustrated in FIG. 11C, the lid part 130 is rotated in the direction indicated by an arrow to push in the semiconductor package 100 to the mounting board 110 side, and is fixed (locked) so that the outer edge part of the lid part 130 comes into contact with the upper surface 70A of the frame part 70. As a result, the connection terminals 47 are compressed in the Z-axis directions to generate predetermined spring pressures, so that it is ensured that the semiconductor package 100 is electrically connected to the first relay board 30 (FIG. 9). That is, the semiconductor package 100 is electrically connected to the mounting board 110 via the socket 10B.

Since the semiconductor package 100 is held by the first positioning and holding part 71, the semiconductor package 100 is prevented from being pressed into the mounting board 110 side beyond the first positioning and holding part 71. Thus, the first positioning and holding part 71 serves also as a stopper to prevent the semiconductor package 100 from being pressed in more than required to cause the connection terminals 47 to deform more than required to be broken.

Thus, according to the second embodiment, in a socket for electrically connecting an object of connection such as a semiconductor package to a mounting board such as a motherboard, the socket including a frame part and a first relay board, the first relay board is connected onto the mounting board, and connection terminals having a spring characteristic come into contact with the noble metal layer of the first relay board. Therefore, high connection reliability is obtained. (It is not possible to obtain sufficient connection reliability by causing connection terminals having a spring characteristic to come into direct contact with a conductor layer (pads) of the mounting board, the conductor layer having no noble metal layer provided on its surface, without providing the first relay board.)

Further, the socket has connection terminals with a spring characteristic provided on the semiconductor package on its side to connect to the first relay board so as to have a structure without a housing that causes warpage. Therefore, it is possible to provide a socket that is less likely to warp. By preventing the occurrence of warpage, it is possible to increase the reliability of the connection between the semiconductor package and the mounting board.

Further, manufacturing the first relay board using the same material or a material having the same coefficient of thermal expansion as that of the mounting board (at least as a principal component) results in the first relay board and the mounting board having the same coefficient of thermal expansion. Therefore, the first relay board warps in the same direction as the mounting board even if the mounting board warps. Thus, it is possible to increase the reliability of the connection between the first relay board and the mounting board.

Further, unlike in the first embodiment or its variation, the second relay board is not used. Therefore, according to this embodiment, the socket may be reduced in thickness.

In terms of replaceability with a new product in the case of, for example, breakage of a connection terminal, the first embodiment and its variation are more suitable than the second embodiment.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present inventions have been described in detail, it should be understood that various changes, substitutions, and alterations could be made hereto without departing from the spirit and scope of the invention.

For example, in the first embodiment, its variation, and the second embodiment, cases are illustrated where a socket according to an embodiment of the present invention is applied to a mounting board such as a motherboard. However, a socket according to an embodiment of the present invention may also be applied to a semiconductor package testing board or the like. For example, application of a socket according to an embodiment of the present invention to the semiconductor package testing board makes it possible to repeatedly conduct a test of electrical characteristics of a semiconductor package.

What is claimed is:

1. A socket, comprising:
    a first relay board mounted on a mounting board;
    a second relay board detachably mounted on the first relay board; and
    a frame part fixed to the first relay board,
    wherein the frame part is configured to position and hold the first relay board and the second relay board, and to position detachably and hold an object of connection on the second relay board, the first relay board includes
a first conductor layer and a second conductor layer formed on a first surface and a second surface, respectively, of the first relay board, the first surface facing away from the mounting board, the second surface facing toward the mounting board, the second conductor layer being electrically connected to the mounting board,
the second relay board includes
a third conductor layer and a fourth conductor layer formed on a first surface and a second surface, respectively, of the second relay board, the first surface facing away from the mounting board, the second surface facing toward the mounting board; and
a first connection terminal and a second connection terminal, each having a spring characteristic, formed on the third conductor layer and the fourth conductor layer, respectively, and
wherein the first connection terminal and the second connection terminal are configured to come into contact with a pad of the object of connection and the first conductor layer, respectively, so that the object of connection and the mounting board are electrically connected.

2. The socket as claimed in claim 1, wherein the frame part is configured to position and hold the first relay board, the second relay board, and the object of connection so as to prevent an interval between the first relay board and the second relay board and an interval between the second relay board and the object of connection from being less than or equal to respective predetermined values.

3. The socket as claimed in claim 1, wherein at least one of the first connection terminal and the second connection terminal includes
a first end part;
a second end part positioned to face the first end part; and
a curved part between the first end part and the second end part.

4. The socket as claimed in claim 1, wherein a principal component of the mounting board and a principal component of the first relay board are materials having a same coefficient of thermal expansion.

5. The socket as claimed in claim 1, wherein:
the pad of the object of connection is a plurality of the pads arranged in a grid, and
the second connection terminal is a plurality of the second connection terminals arranged in correspondence to the pads.

6. The socket as claimed in claim 1, wherein:
the frame part includes a plurality of projecting parts on an interior surface thereof,
the second relay board includes a plurality of cut parts on an outer edge part thereof, and
the second relay board is positioned with the cut parts being fit to the projecting parts.

7. The socket as claimed in claim 1, wherein:
the first relay board further includes a noble metal layer stacked on the first conductor layer, and
the first connection terminal and the second connection terminal are configured to come into contact with the pad of the object of connection and the noble metal layer, respectively, in response to the object of connection being pressed toward the mounting board with the frame part having the object of connection mounted on the second relay board, so that the object of connection and the mounting board are electrically connected.

8. The socket as claimed in claim 1, wherein:
the pad of the object of connection is a plurality of the pads arranged in a grid, and
the first connection terminal is a plurality of the first connection terminals arranged in correspondence to the pads.

9. The socket as claimed in claim 8, wherein, in a plan view, the first connection terminals are arranged with an inclination relative to the pads arranged in the grid.

10. A socket, comprising:
a relay board mounted on a mounting board; and
a frame part fixed to the relay board,
wherein the frame part is configured to position and hold the relay board, and to position detachably and hold an object of connection, having a connection terminal having a spring characteristic, on the relay board so that the connection terminal faces the relay board,
the relay board includes
a first conductor layer and a second conductor layer formed on a first surface and a second surface, respectively, of the relay board, the first surface facing away from the mounting board, the second surface facing toward the mounting board, the second conductor layer being electrically connected to the mounting board, and
the connection terminal comes into contact with the first conductor layer so that the object of connection and the mounting board are electrically connected.

11. The socket as claimed in claim 10, wherein the frame part is configured to position and hold the relay board and the object of connection so as to prevent an interval between the relay board and the object of connection from being less than or equal to a predetermined value.

12. The socket as claimed in claim 10, wherein the connection terminal includes
a first end part;
a second end part positioned to face the first end part; and
a curved part between the first end part and the second end part.

13. The socket as claimed in claim 10, wherein a principal component of the mounting board and a principal component of the relay board are materials having a same coefficient of thermal expansion.

14. The socket as claimed in claim 10, wherein:
the relay board further includes a noble metal layer stacked on the first conductor layer, and
the connection terminal comes into contact with the noble metal layer in response to the object of connection being pressed toward the mounting board with the frame part having the object of connection mounted on the relay board, so that the object of connection and the mounting board are electrically connected.

15. The socket as claimed in claim 10, wherein:
the object of connection includes a plurality of pads arranged in a grid, and
the connection terminal is a plurality of the connection terminals arranged in correspondence to the pads.

16. The socket as claimed in claim 15, wherein, in a plan view, the connection terminals are arranged with an inclination relative to the pads arranged in the grid.

* * * * *